United States Patent
Wu

(10) Patent No.: US 12,374,613 B2
(45) Date of Patent: Jul. 29, 2025

(54) SEMICONDUCTOR STRUCTURE AND METHOD FOR MANUFACTURING THE SAME

(71) Applicant: TAIWAN SEMICONDUCTOR MANUFACTURING COMPANY, LTD., Hsinchu (TW)

(72) Inventor: Tung-Jiun Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/229,679

(22) Filed: Aug. 3, 2023

(65) Prior Publication Data
US 2023/0378048 A1 Nov. 23, 2023

Related U.S. Application Data

(62) Division of application No. 17/313,508, filed on May 6, 2021, now Pat. No. 11,776,895.

(51) Int. Cl.
*H01L 23/522* (2006.01)
*H01L 23/528* (2006.01)

(52) U.S. Cl.
CPC ...... *H01L 23/5222* (2013.01); *H01L 23/5226* (2013.01); *H01L 23/528* (2013.01)

(58) Field of Classification Search
CPC .............. H01L 23/5222; H01L 23/5226; H01L 23/528
See application file for complete search history.

(56) References Cited

U.S. PATENT DOCUMENTS

| | | | |
|---|---|---|---|
| 6,184,126 B1 * | 2/2001 | Lee | H01L 21/31155 438/653 |
| 8,653,664 B2 * | 2/2014 | Liu | H01L 21/76846 257/E23.161 |
| 8,975,749 B2 | 3/2015 | Liu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,437,484 B2 | 9/2016 | JangJian et al. | |
| 9,443,769 B2 | 9/2016 | Wang et al. | |
| 9,502,350 B1 * | 11/2016 | Bonilla | H01L 23/53228 |
| 9,520,482 B1 | 12/2016 | Chang et al. | |
| 9,548,366 B1 | 1/2017 | Ho et al. | |
| 9,576,814 B2 | 2/2017 | Wu et al. | |

(Continued)

FOREIGN PATENT DOCUMENTS

| | | | | |
|---|---|---|---|---|
| CN | 104051333 A | * | 9/2014 | ....... H01L 21/76805 |
| CN | 105529321 A | * | 4/2016 | ....... H01L 21/76802 |

(Continued)

*Primary Examiner* — Laura M Menz
(74) *Attorney, Agent, or Firm* — NZ Carr Law Office

(57) ABSTRACT

A semiconductor structure includes a first dielectric layer, a first metal feature in the first dielectric layer, at least one etch stop layer on the first dielectric layer, a second dielectric layer on the at least one etch stop layer. The semiconductor structure further includes a first barrier sublayer on a sidewall of the second dielectric layer and the at least one etch stop layer, a second barrier sublayer on the first barrier sublayer and the first metal feature, and a second metal feature on the second barrier sublayer.

20 Claims, 25 Drawing Sheets

(56) References Cited

U.S. PATENT DOCUMENTS

| | | | |
|---|---|---|---|
| 9,831,183 B2 | 11/2017 | Lin et al. | |
| 9,859,386 B2 | 1/2018 | Ho et al. | |
| 11,488,857 B2* | 11/2022 | Wang | H01L 21/31155 |
| 11,569,124 B2* | 1/2023 | Tsai | H01L 23/5283 |
| 11,756,920 B2* | 9/2023 | Kao | H01L 24/80 |
| | | | 257/734 |
| 11,776,895 B2* | 10/2023 | Wu | H01L 23/5222 |
| | | | 257/751 |
| 2011/0006429 A1* | 1/2011 | Liu | H01L 21/76867 |
| | | | 257/E23.161 |
| 2014/0127898 A1* | 5/2014 | Liu | H01L 21/76831 |
| | | | 438/643 |
| 2017/0186683 A1* | 6/2017 | Lin | H01L 23/53228 |
| 2018/0158726 A1* | 6/2018 | Lin | H01L 23/53228 |
| 2018/0211870 A1* | 7/2018 | Chae | H01L 21/76808 |
| 2019/0164748 A1* | 5/2019 | Chou | H01L 21/76802 |
| 2019/0237356 A1* | 8/2019 | Srivastava | H01L 23/5226 |
| 2020/0006129 A1* | 1/2020 | Chae | H01L 21/76832 |
| 2020/0251418 A1* | 8/2020 | Lin | H01L 23/485 |
| 2021/0035856 A1* | 2/2021 | Tsai | H01L 21/76885 |
| 2021/0134660 A1* | 5/2021 | Wang | H01L 21/76825 |
| 2022/0328447 A1* | 10/2022 | Kao | H01L 23/5283 |
| 2022/0359373 A1* | 11/2022 | Wu | H01L 21/76849 |
| 2023/0063438 A1* | 3/2023 | Lee | H01L 21/76826 |
| 2023/0378048 A1* | 11/2023 | Wu | H01L 23/5222 |

FOREIGN PATENT DOCUMENTS

| | | | | |
|---|---|---|---|---|
| CN | 115000043 A | * | 9/2022 | ......... H01L 23/5222 |
| CN | 115602618 A | * | 1/2023 | ....... H01L 21/76802 |
| DE | 102015107271 A1 | * | 4/2016 | ....... H01L 21/76802 |
| DE | 102018108893 A1 | * | 5/2019 | ......... C23C 16/0272 |
| DE | 102015108695 B4 | * | 2/2020 | ....... H01L 21/76805 |
| TW | 377492 B | | 12/1999 | |
| TW | 201925517 A | | 7/2019 | |
| TW | 202008509 A | | 2/2020 | |
| WO | 03007367 A1 | | 1/2003 | |

* cited by examiner

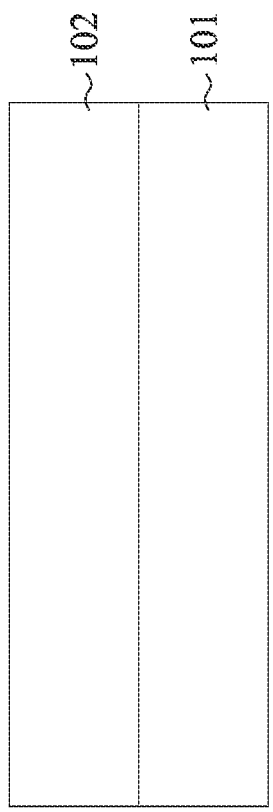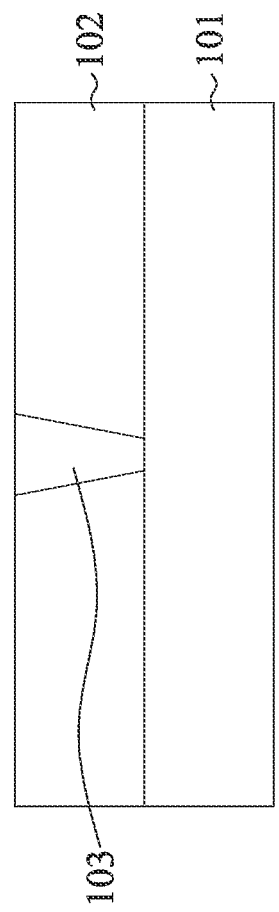

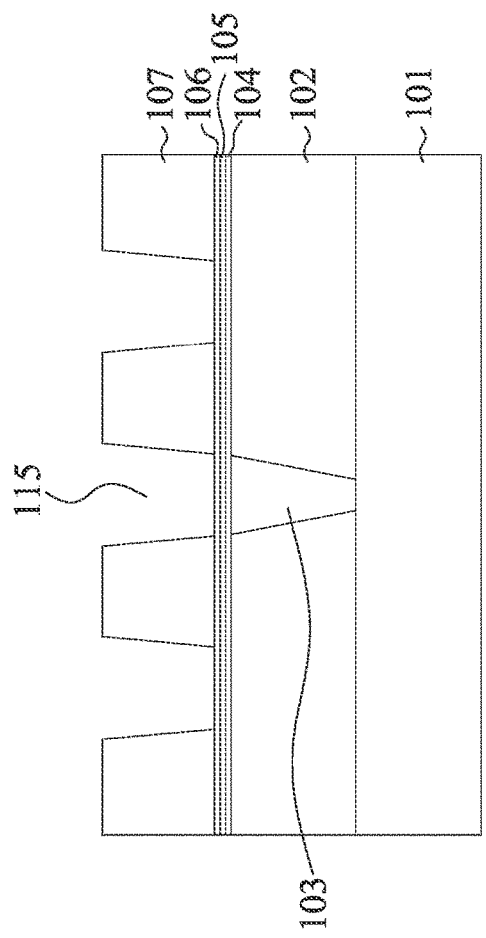
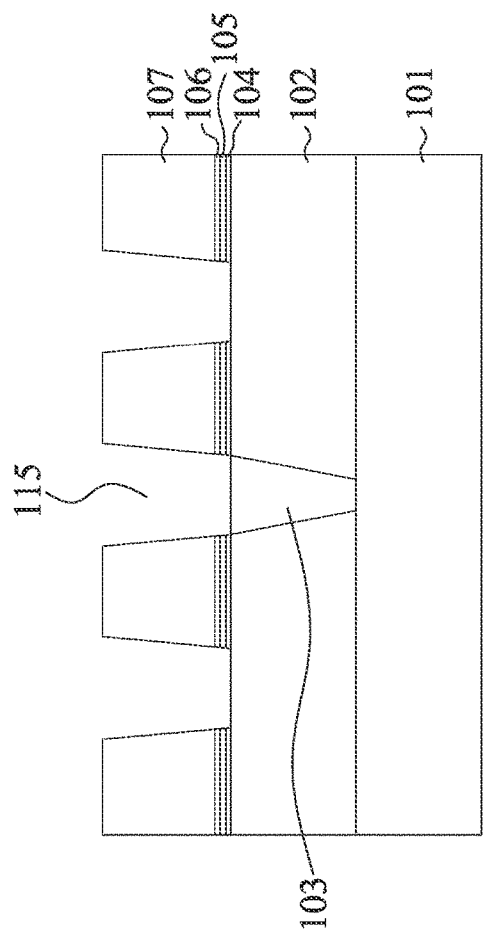
FIG. 3E
FIG. 3F

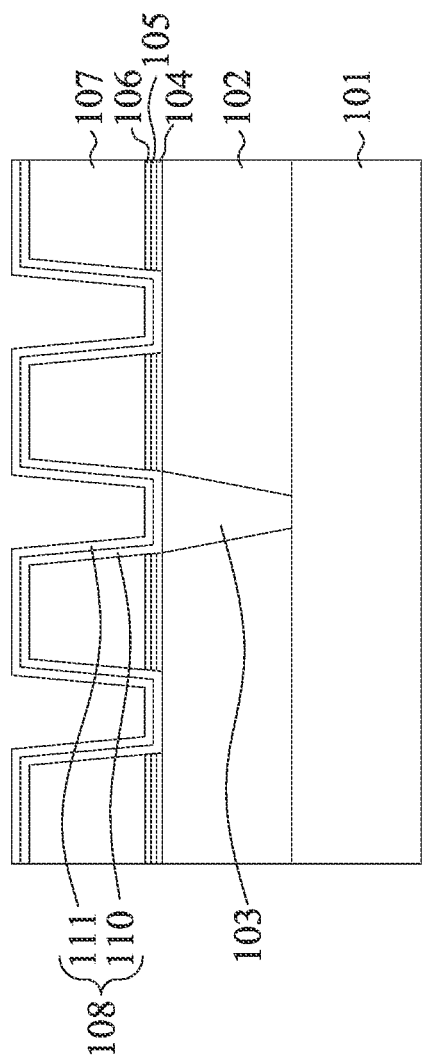
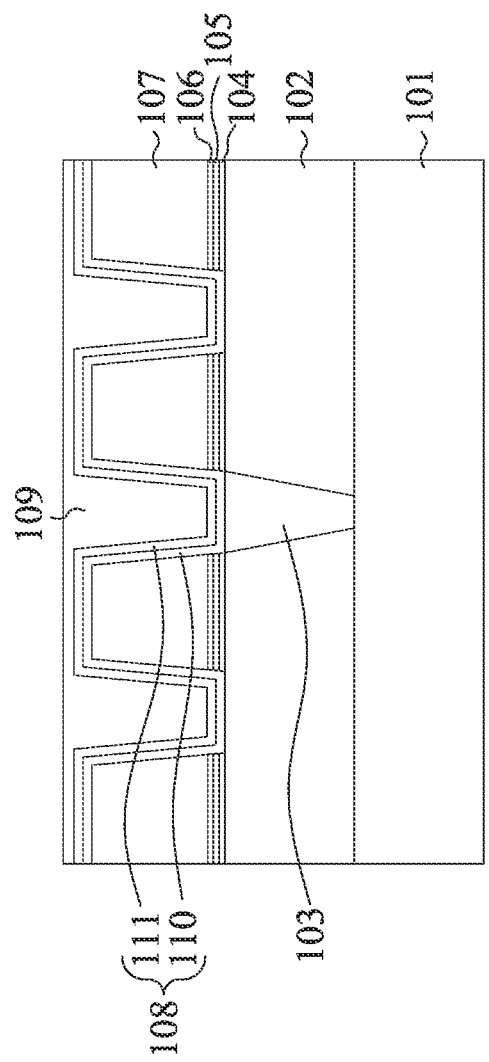

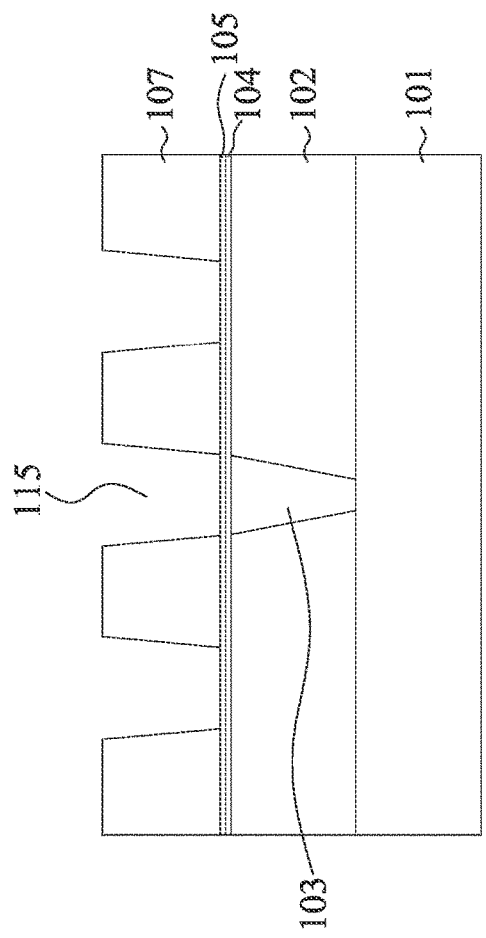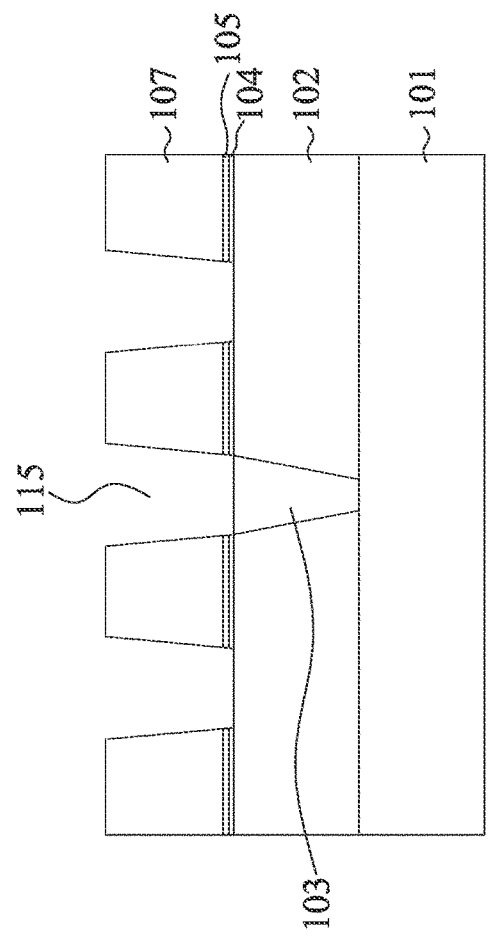

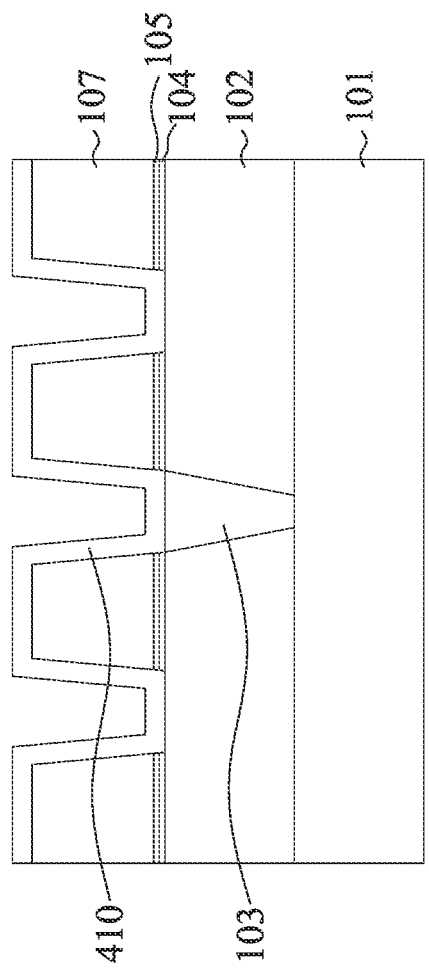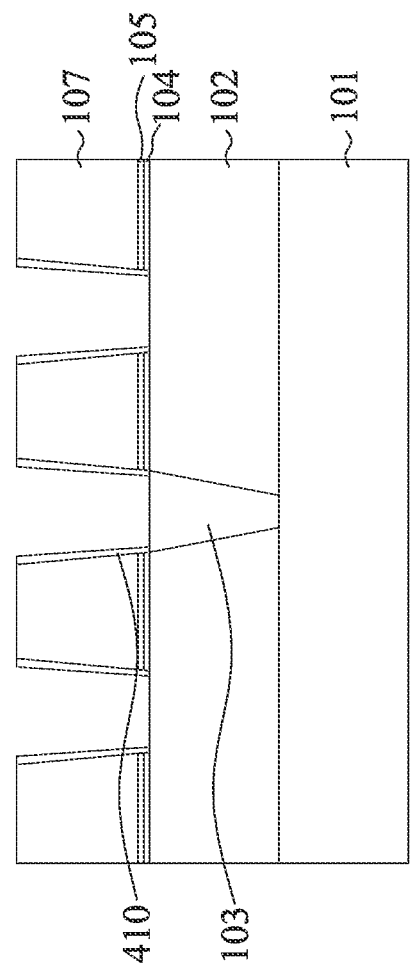

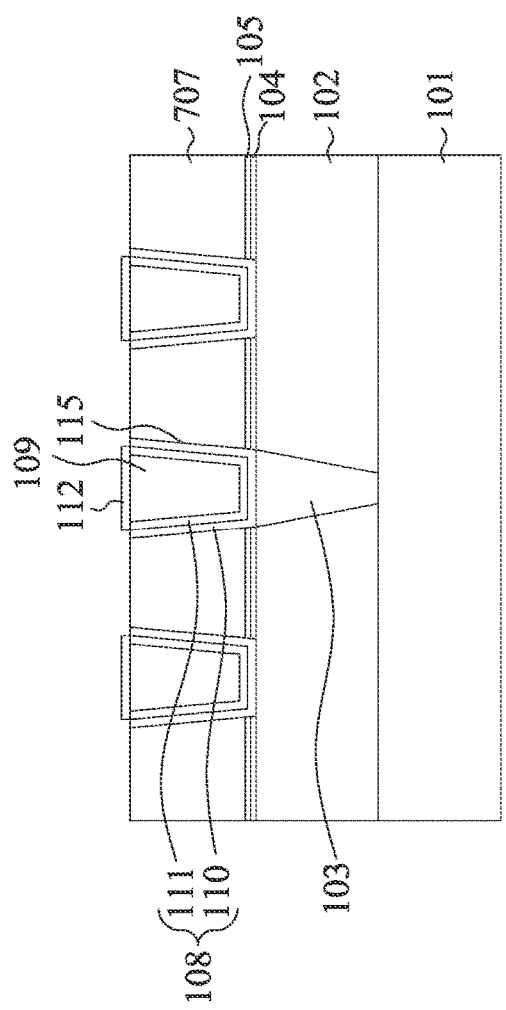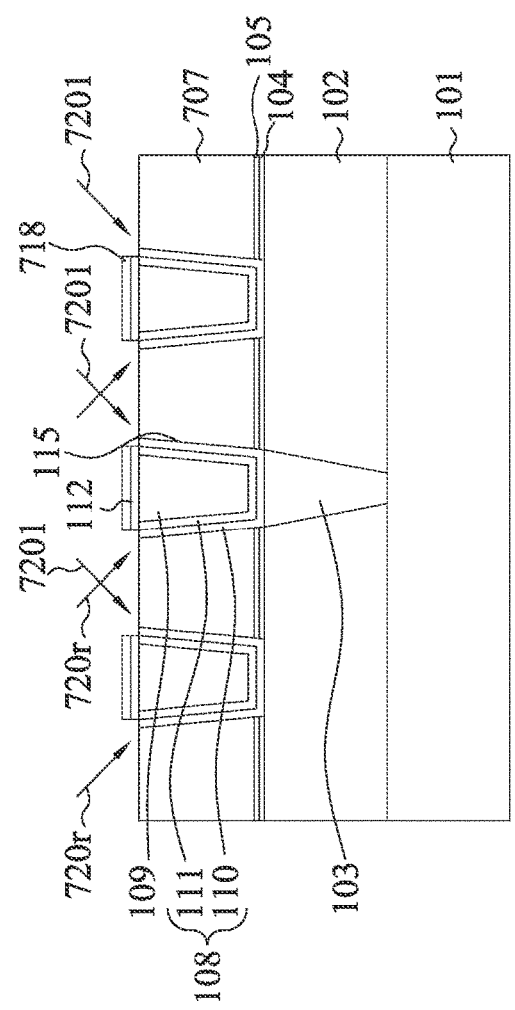
FIG. 9A
FIG. 9B

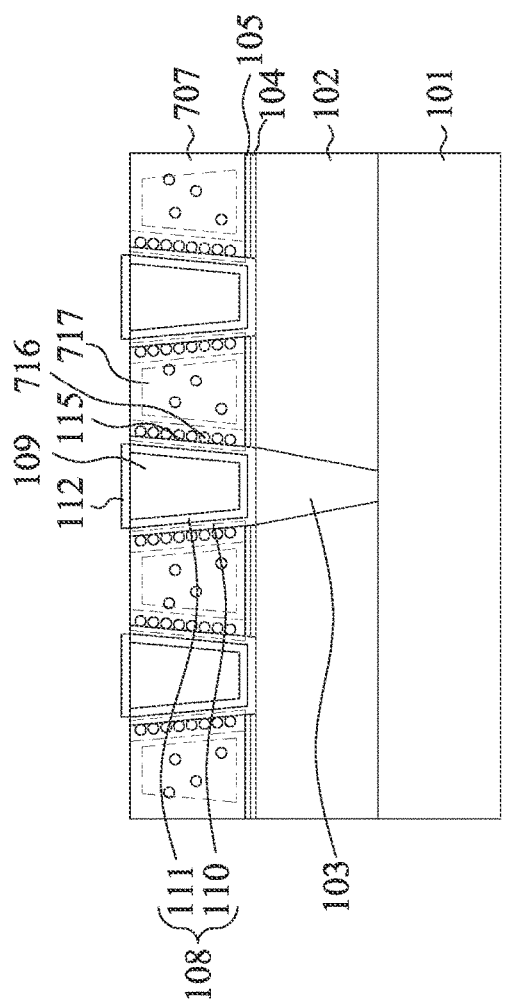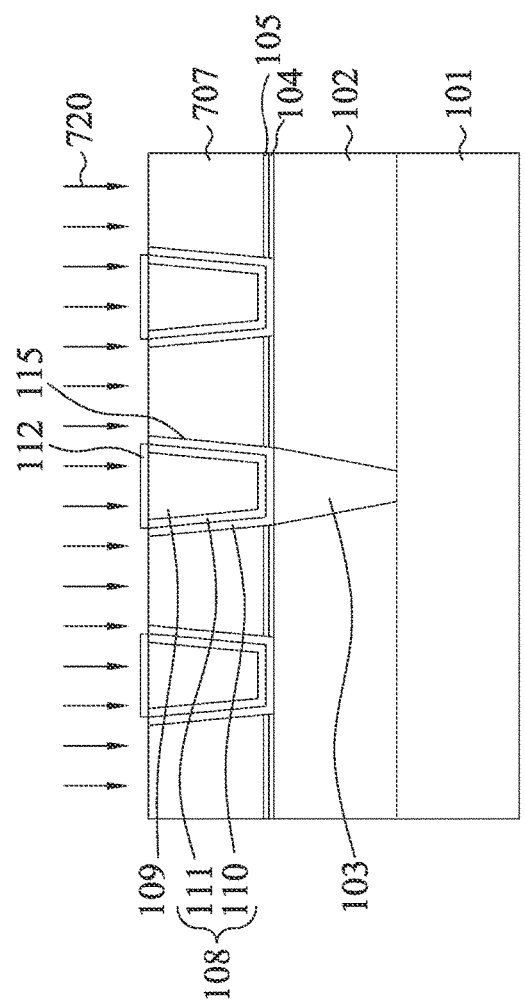

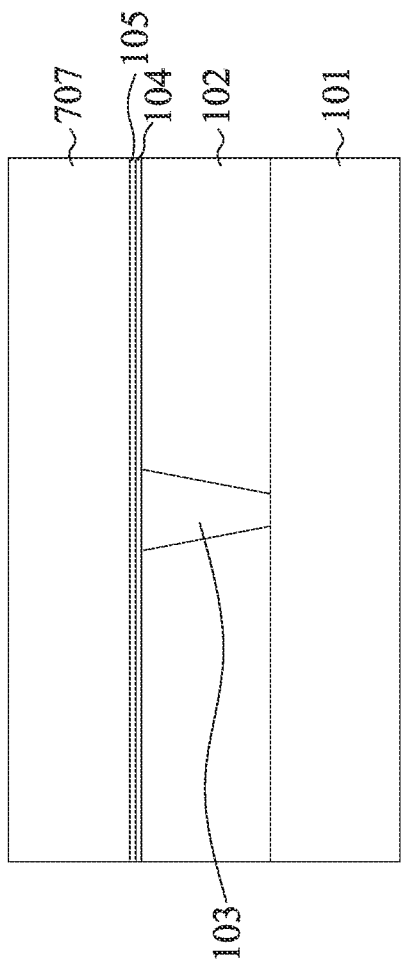
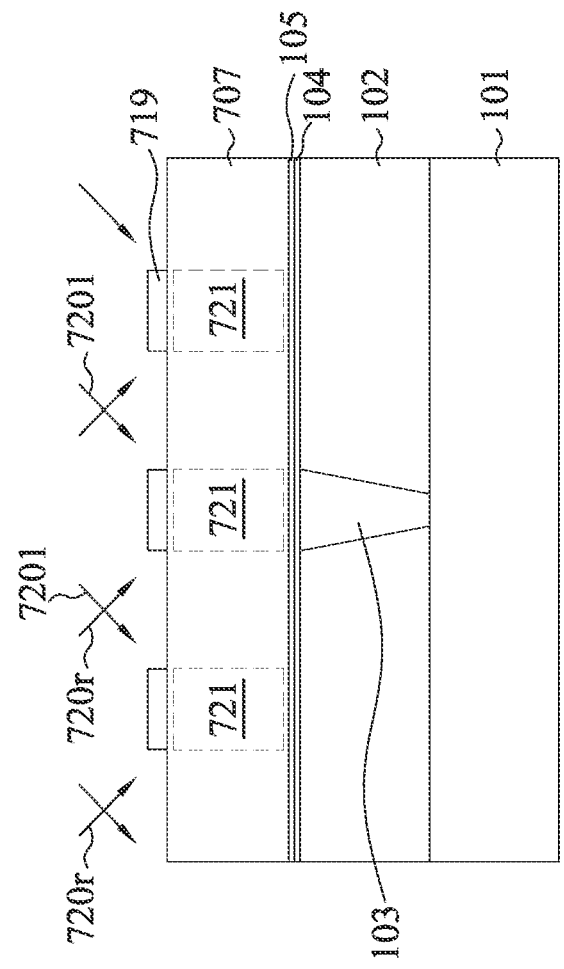
FIG. 10A
FIG. 10B

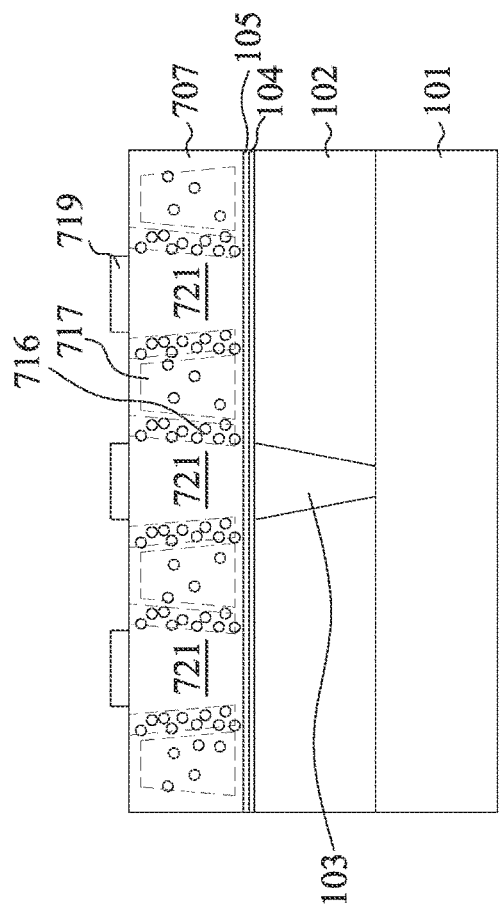
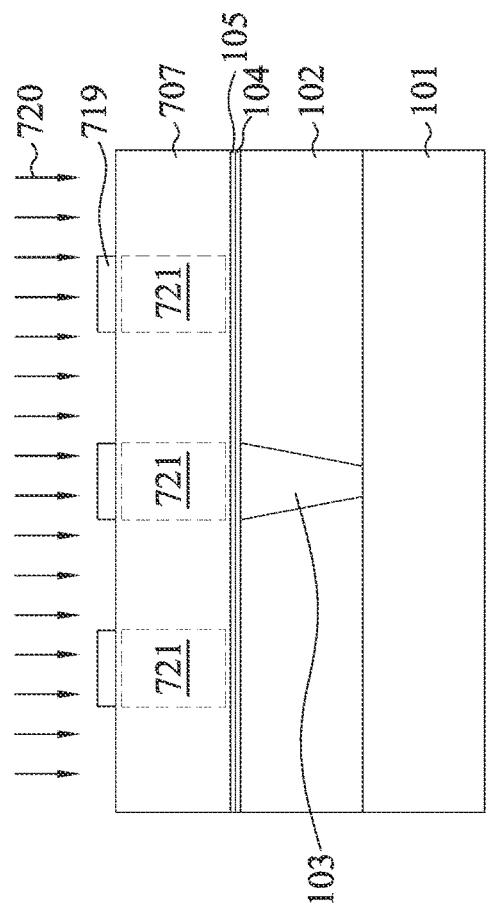
FIG. 10C
FIG. 10D

SEMICONDUCTOR STRUCTURE AND METHOD FOR MANUFACTURING THE SAME

CROSS-REFERENCE TO RELATED APPLICATIONS

This application is a divisional application of U.S. patent application Ser. No. 17/313,508 filed May 6, 2021, which is incorporated by reference in its entirety.

BACKGROUND

As the feature size of integrated circuits (ICs) is continuously scaling down, the speed of the device increases due to a shorter channel length, although, resistance-capacitance (RC) delay produced by the interconnects limits the chip speed. With the advance of the technology node, the smaller line width and pitch result in the increased resistance of the metal lines and the increased capacitance between the neighboring metal lines. This leads to a larger RC delay in the advanced technology nodes and becomes a limiting factor in ICs performance. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3J illustrate cross-sectional views in various stages of forming a semiconductor structure in accordance with some embodiments.

FIGS. 6A-6L illustrate cross-sectional views in various stages of forming a semiconductor structure in accordance with some embodiments.

FIGS. 9A-9E illustrate cross-sectional views in various stages of forming a semiconductor structure in accordance with some embodiments.

FIGS. 10A-10G illustrate cross-sectional views in various stages of forming a semiconductor structure in accordance with some embodiments.

DETAILED DESCRIPTION

Figure 1:
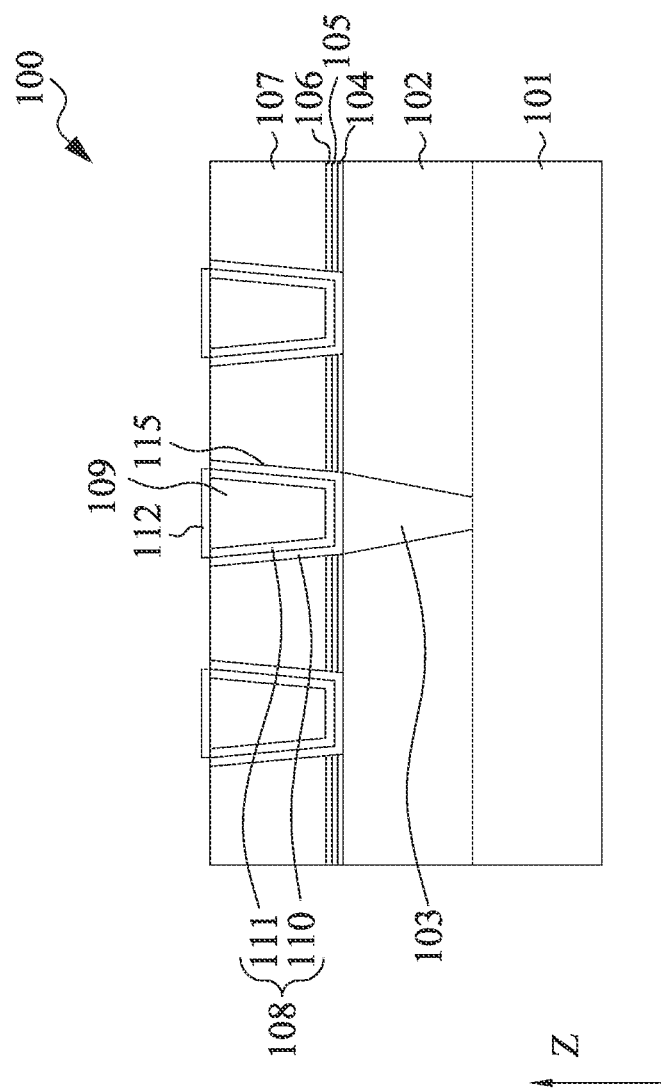
FIG. 1 is a cross-sectional view of a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

IC fabrication is a complex process in which an electronic circuit is formed on a wafer made of semiconductor material. The manufacturing is a multiple-step sequence which can generally be divided into two major processing stages, namely the front end of line (FEOL) processing and the back end of line (BEOL) processing. FEOL refers to the construction of the components of the IC directly inside the wafer. Once all the components of the IC are ready, the BEOL processing steps are performed to deposit the metal wiring between the individual devices in order to interconnect them. Embodiments of the present disclosure generally relate to improved structures of BEOL which reduce the RC delay and current leakage between neighboring metal lines. Embodiments of the present disclosure also relate to methods for fabricating the improved structures of BEOL.

FIG. 1 is a cross-sectional view of a semiconductor structure 100 in accordance with some embodiments. The semiconductor structure 100 may be an integrated circuit (IC) chip, system on chip (SoC), or portion thereof. Referring to FIG. 1, the semiconductor structure 100 may be at a stage after the FEOL processing or between metal layers in the BEOL processing.

The semiconductor structure 100 includes a substrate 101, a first dielectric layer 102, a first metal feature 103, a first etch stop layer 104, a second etch stop layer 105, a third etch stop layer 106, a second dielectric layer 107, a barrier layer 108, and a second metal feature 109.

The substrate 101 may be a portion of a semiconductor wafer. In some embodiments, the substrate 101 can be a bare semiconductor bulk wafer, a top layer of a semiconductor on insulator (SOI) wafer, or a partially (or fully) fabricated semiconductor wafer that includes previously formed layers, such as front end of the line (FEOL), middle of the line (MOL) and/or BEOL layers. By way of example and not limitation, the substrate 101 can be made of (i) an elementary semiconductor, such as silicon (Si) or germanium (Ge); (ii) a compound semiconductor, such as silicon germanium (SiGe), silicon carbide (SiC), gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iii) combinations thereof. In some embodiments, the wafer can be a non-semiconductor wafer such as, for example, quartz. The substrate 101 may include a plurality of devices, such as transistors, diodes, imaging sensors, resistors, capacitors, inductors, memory cells, a combination thereof, and/or other suitable devices as the structural and functional components of the semiconductor structure 100.

The first dielectric layer 102 is formed on the substrate 101. In some embodiments, the first dielectric layer 102 may be an inter-layer dielectric (ILD) layer formed over active and/or passive devices on the substrate 101 during FEOL processing. In other embodiments, the first dielectric layer 102 may be an inter metal dielectric (IMD) layer in an interconnect structure formed over the substrate 101 during BEOL processing. In some embodiments, the first dielectric layer 102 may include plasma enhanced oxide (PEOX), silicon nitride, silicon carbide, or combinations thereof. The first dielectric layer 102 may be a single layer or multiple layers. The first metal feature 103 is formed in the first dielectric layer 102 in contact with the substrate 101. The first metal feature 103 may be in contact with one or more metal features or active regions (not shown) formed in the substrate 101. The first metal feature 103, or also named via, is a vertical interconnect access line running through the first dielectric layer 102 in a vertical direction (e.g., z-direction) and create electrical connections to layers above and/or below the first dielectric layer 102. In some embodiments, a plurality of first metal features 103 is formed in the first dielectric layer 102. Further, in some embodiments, one or more barrier layers (not shown) can be formed between the first dielectric layer 102 and the substrate 101 and/or between the first dielectric layer 102 and the first metal feature 103. In some embodiments, the first metal feature 103 can be fabricated from aluminum (Al), copper (Cu) or metal alloy, such as aluminum copper (AlCu).

The first etch stop layer 104 is formed on the first dielectric layer 102. The first etch stop layer 104 can be fabricated from a metallic oxide material, such as $Al_xO_y$, or $Si_xO_y$, a metallic nitride material, such as AlN, $Al_xO_yN_z$ or $Si_xN_y$, or other materials and/or combinations thereof. The first etch stop layer 104 may have a thickness of about 10 Å to about 30 Å. The second etch stop layer 105 is formed on the first etch stop layer 104. The second etch stop layer 105 can include a metallic oxide material, such as $Al_xO_y$, or $Si_xO_y$, a metallic nitride material, such as AlN, $Al_xO_yN_z$ or $Si_xN_y$, or other materials and/or combinations thereof. The second etch stop layer 105 may have a thickness of about 10 Å to about 30 Å. The third etch stop layer 106 is formed on the second etch stop layer 105. The third etch stop layer 106 can be fabricated from a metallic oxide material, such as $Al_xO_y$, or $Si_xO_y$, a metallic nitride material, such as AlN, $Al_xO_yN_z$ or $Si_xN_y$, or other materials and/or combinations thereof. The third etch stop layer 106 may have a thickness of about 10 Å to about 30 Å. In some embodiments, the total thickness of the first etch stop layer 104, the second etch stop layer 105 and the third etch stop layer 106 is about 40 Å to about 60 Å.

The second etch stop layer 105 is a material different than that of the first etch stop layer 104. The third etch stop layer 106 is a material different than that of the second etch stop layer 105. In some embodiments, the first etch stop layer 104 and the third etch stop layer 106 are the same material. In some embodiments, one or more etch stop layers can be further formed on the third etch stop layer 106.

The second dielectric layer 107 is formed on the third etch stop layer 106. In some embodiments, the second dielectric layer 107 may be an IMD layer in an interconnect structure formed over the substrate 101 during BEOL processing. The second dielectric layer 107 is disposed over at least a portion of the first dielectric layer 102 and/or the first metal feature 103. The second dielectric layer 107 can be low-k dielectrics, silicon dioxide, silicon nitrides, and/or silicon oxynitrides. Low-k dielectric materials can have a dielectric constant (k-value) smaller than 4.0 and may have a porous microstructure. Low-k materials can reduce unwanted parasitic capacitances (e.g., due to their low k-value), and therefore mitigate resistance-capacitance (RC) delays.

One or more trenches 115 are formed through the first etch stop layer 104, the second etch stop layer 105, the third etch stop layer 106 and the second dielectric layer 107. The trenches 115 may include openings of all shapes formed in the second dielectric layer 107 for subsequent metal filling. For example, the trenches 115 may include elongated openings for forming metal lines, and via openings for forming metal vias. The trench 115 exposes at least a portion of the first metal feature 103. In some embodiments, the trench 115 exposes portions of the first dielectric layer 102. The barrier layer 108 is formed on the sidewall of the first etch stop layer 104, the second etch stop layer 105, the third etch stop layer 106 and the second dielectric layer 107, and in contact with the top of the first metal feature 103. In some embodiment, the barrier layer 108 is a single layer of tantalum nitride (TaN) or cobalt (Co). The barrier layer 108 may be a bi-layer or a multi-layer structure. In some embodiments, the barrier layer 108 includes a first barrier sublayer 110 and a second barrier sublayer 111. In some embodiments, the first barrier sublayer 110 is formed on the sidewall of the first etch stop layer 104, the second etch stop layer 105, the third etch stop layer 106 and the second dielectric layer 107 and on at least a portion of the first metal feature 103 (i.e., the bottom of the trench 115), and the second barrier sublayer 111 is formed on the first barrier sublayer 110. In some embodiments, the first barrier sublayer 110 is formed on the sidewall of the first etch stop layer 104, the second etch stop layer 105, the third etch stop layer 106 and the second dielectric layer 107, and the second barrier sublayer 111 is formed on the first barrier sublayer 110 and at least a portion of the first metal feature 103.

The barrier layer 108 serves as a cap layer to prevent a subsequently deposited metal (e.g., copper) from diffusing into the first dielectric layer 102 or the second dielectric layer 107. The first barrier sublayer 110 is a refractory metal nitride, such as tantalum nitride (TaN), titanium nitride (TiN), tungsten nitride (WN), or ruthenium nitride (RuN). The second barrier sublayer 111 is a metal, such as cobalt (Co) or ruthenium (Ru). The second metal feature 109 is formed on the barrier layer 108 and fills the trench 115. The second metal feature 109 can be fabricated from aluminum (Al), copper (Cu) or metal alloy, such as aluminum copper (AlCu). In some embodiments, a cap layer 112 is formed on the second metal feature 109. The cap layer 112 may be fabricated from the same material as the second barrier sublayer 111.

Figure 2:
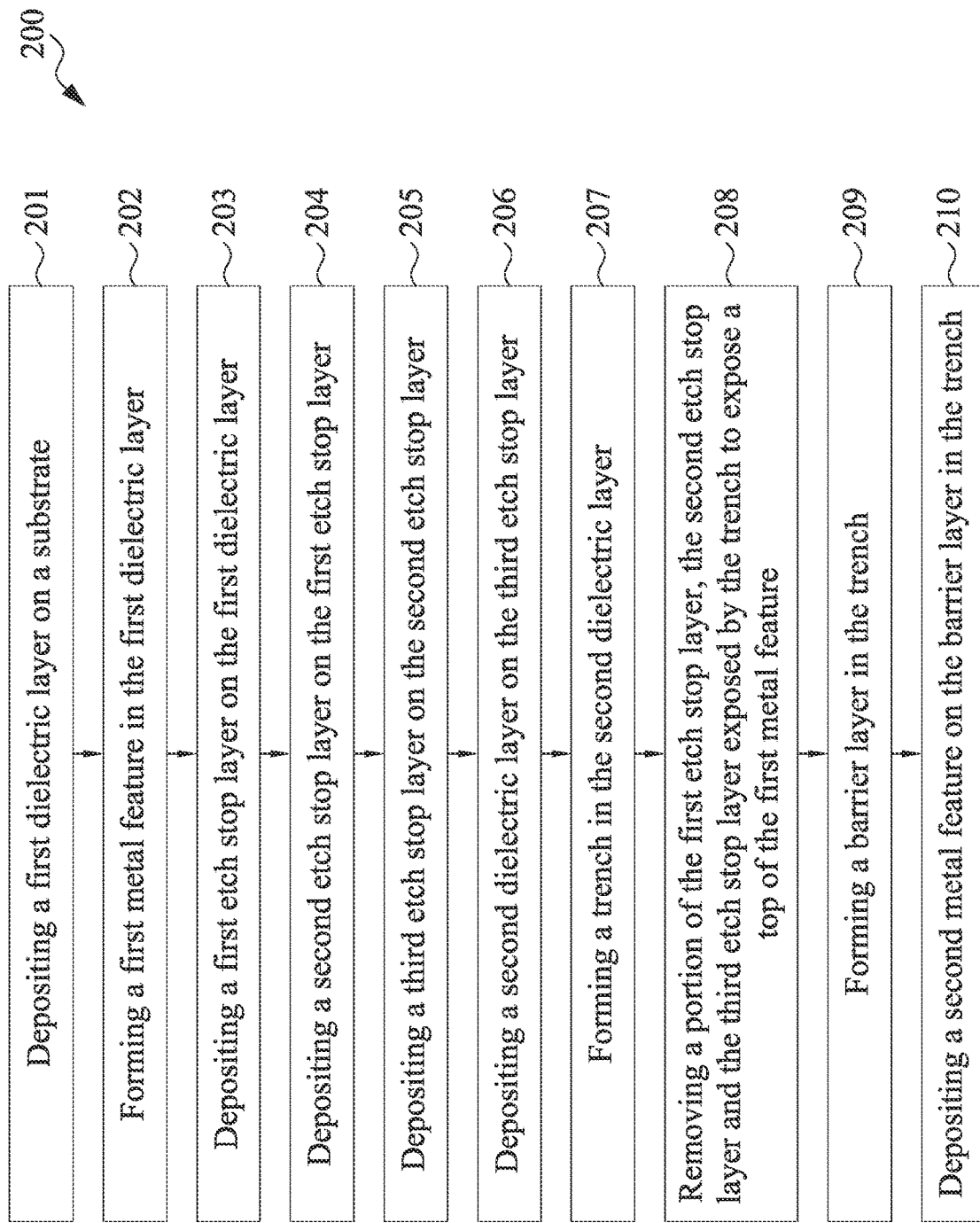
FIG. 2 is a flow chart of a method of manufacturing a semiconductor structure in accordance with some embodiments.
Figure 3C:
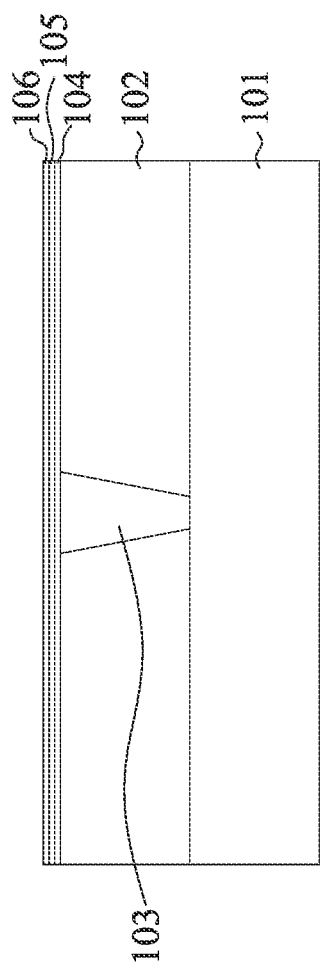

FIG. 2 is a flow chart of a method 200 of manufacturing the semiconductor structure 100 in accordance with some embodiments. FIGS. 3A-3J illustrate cross-sectional views in various stages of forming the semiconductor structure 100 in accordance with some embodiments. At operation 201, the first dielectric layer 102 is deposited on the substrate 101, as shown in FIG. 3A. The first dielectric layer 102 is formed by any suitable deposition method, such as chemical vapor deposition (CVD), spin-on coating, or plasma enhanced chemical vapor deposition (PECVD). In some embodiments, before forming the first dielectric layer 102 on the substrate 101, one or more barrier layers can be formed on the substrate 101, and the first dielectric layer 102 is formed on the one or more barrier layers.

Referring to FIGS. 2 and 3B, at operation 202, the first metal feature 103 is formed in the first dielectric layer 102 in contact with the substrate 101. The first metal feature 103 may be formed by forming an opening in the first dielectric layer 102 and filling a metal layer in the opening. The metal layer may be formed by any suitable deposition method, such as physical vapor deposition (PVD) or electro-chemical plating (ECP). A planarization process, such as a chemical mechanical polishing (CMP) process, is followed to remove excessive metal layer and form the first metal feature 103. Further, in some embodiments, one or more barrier layers can be formed in the opening of the first dielectric layer 102 prior to filling the opening with the metal layer, and the first metal feature 103 is formed on the one or more barrier layers in the opening.

Referring to FIGS. 2 and 3C, at operations 203-205, the first etch stop layer 104, the second etch stop layer 105 and the third etch stop layer 106 are sequentially deposited on the first dielectric layer 102 and the first metal feature 103. In some embodiments, the first etch stop layer 104 is a nitride, such as AlN, the second etch stop layer 105 is an oxide, such as $AlO_x$ and the third etch stop layer 106 is a nitride, such as AlN. The first etch stop layer 104, the second etch stop layer 105 and the third etch stop layer 106 can be formed by any suitable method, such as, for example, CVD, PECVD, or atomic layer deposition (ALD). In some embodiments, one or more etch stop layers can be further formed on the third etch stop layer 106.

Figure 3D:
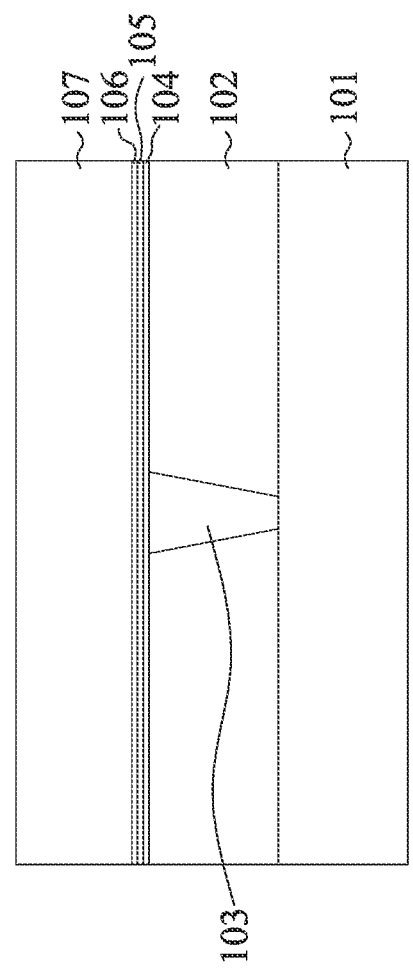

Referring to FIGS. 2 and 3D, at operation 206, the second dielectric layer 107 is deposited on the third etch stop layer 106. The second dielectric layer 107 can be formed by CVD, a spin-on coating process, and/or any other suitable methods.

After forming the second dielectric layer 107, at operation 207, the trench 115 is formed in the second dielectric layer 107 as shown in FIG. 3E. The trench 115 can be formed by any suitable etching process, such as wet etching or dry etching process. In some embodiments, operation 207 is performed by a patterning process followed by a dry etch process. The dry etch process may use a fluorine-based plasma to expose a portion of the third etch stop layer 106. Alternatively, the dry etch process may be a physical bombardment process that uses argon (Ar), helium (He) or nitrogen ($N_2$), for example, to expose at least a portion of the third etch stop layer 106.

At operation 208, one or more etching processes are performed to remove portions of the third etch stop layer 106, the second etch stop layer 105 and the first etch stop layer 104 exposed through the trench 115, as shown in FIG. 3F. Operation 208 can be performed by any suitable etching process, such as wet etching, dry etching process, or combinations thereof. The etching process may be selective, so the portions of the first, second and third etch stop layers 104, 105, 106 are removed, while the remaining portions of the second dielectric layer 107 remain intact. In some embodiments, the exposed portions of the first etch stop layer 104, the second etch stop layer 105 and the third etch stop layer 106 are removed using one chemical solution in a wet etch process. In some embodiments, each portion of the first etch stop layer 104, the second etch stop layer 105 and the third etch stop layer 106 is removed using different chemical solutions in different wet etch processes.

Referring to FIGS. 2 and 3G, at operation 209, the barrier layer 108 is formed on the exposed surfaces of the second dielectric layer 107, the first metal feature 103, and the first dielectric layer 102. The barrier layer 108 may be conformal to the sidewall and bottom of the trench 115. In some embodiments, the barrier layer 108 includes the first barrier sublayer 110 and the second barrier sublayer 111. The first barrier sublayer 110 is conformally formed on the sidewall of the first etch stop layer 104, the second etch stop layer 105, the third etch stop layer 106 and the second dielectric layer 107, and the second barrier sublayer 111 is deposited on the first barrier sublayer 110. The first barrier sublayer 110 may have a thickness of approximately 10 Å to 100 Å and can be formed by CVD, PVD, ALD, or any suitable deposition technique. The second barrier sublayer 111 may have a thickness of approximately 10 Å to 100 Å and can be formed by CVD, PVD, ALD, or any suitable deposition technique.

Figure 3I:
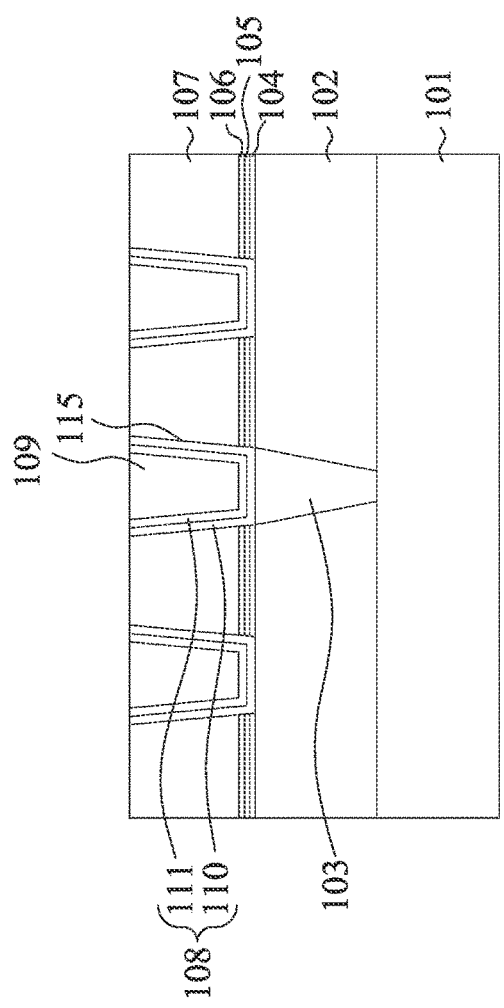
Figure 3J:
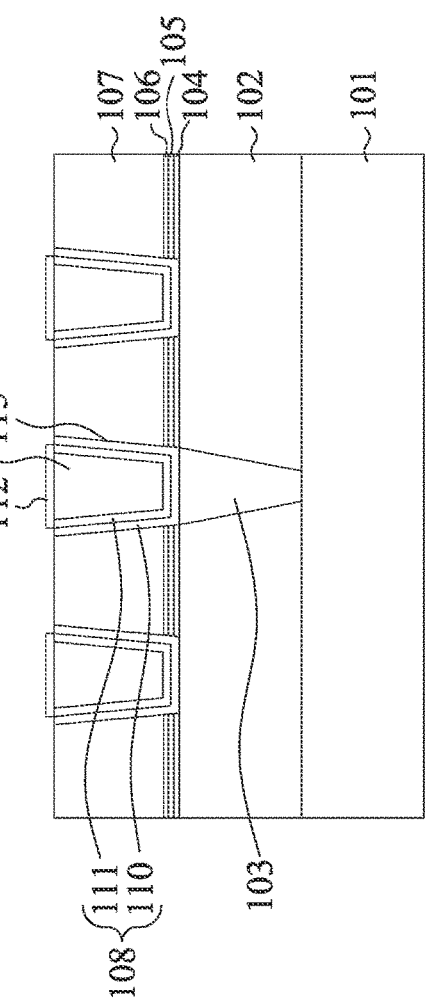

Referring to FIGS. 2 and 3H, at operation 210, the second metal feature 109 is deposited on the barrier layer 108 in the trench 115. The second metal feature 109 can be Cu formed by an ECP process or any suitable deposition technique. After depositing the second metal feature 109, a CMP process can be used to remove portions of the barrier layer 108 and the second metal feature 109 until the top surfaces of the second dielectric layer 107 are exposed, as shown in FIG. 3I. Next, the cap layer 112 can be selectively deposited on the second metal feature 109, as shown in FIG. 3J.

When removing etch stop layers from bottoms of trenches in a dielectric material during BEOL processing, similar to the process in operation 208, an amount of dielectric material near the bottoms of the trenches may be inadvertently removed, forming undercuts in the dielectric material. When metal features are subsequently formed in the trenches, the metal features may also extend laterally into the undercuts and cause the interface leakage or breakdown between two metal features, for example, between two adjacent second metal features 109, or between the second metal feature 109 and a staggered first metal feature 103. By depositing three or more etch stop layers 104, 105, 106, the undercut in the second dielectric layer 107 during the removal of the etch stop layers can be reduced or prevented. Hence, the interface leakage between different metal structures is reduced.

Figure 4:
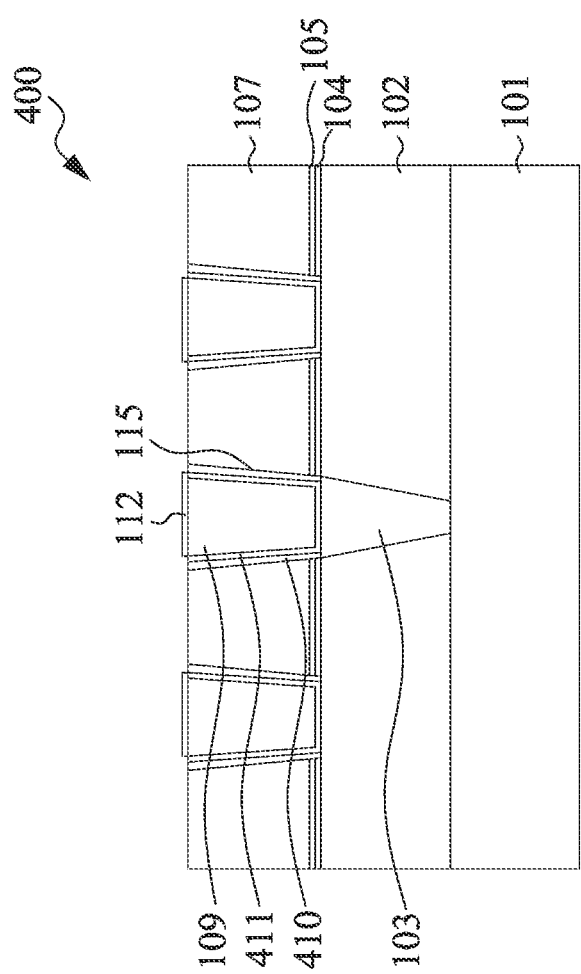
FIG. 4 is a cross-sectional view of a semiconductor structure in accordance with some embodiments.

FIG. 4 is a cross-sectional view of a semiconductor structure 400 in accordance with some embodiments. Referring to FIG. 4, the semiconductor structure 400 may be at a stage after the FEOL processing or between metal layers in the BEOL processing. Similar to the semiconductor structure 100 shown in FIG. 1, the semiconductor structure 400 includes the substrate 101, the first dielectric layer 102, the first metal feature 103, the second dielectric layer 107, and the second metal feature 109. The first dielectric layer 102 is formed on the substrate 101, and the first metal feature 103 is formed in the first dielectric layer 102 and in contact with the substrate 101.

The semiconductor structure 400 further includes an etch stop layer formed on the first dielectric layer 102. In some embodiments, the etch stop layer is a single layer structure, for example, the first etch stop layer 104. In some embodiments, the etch stop layer is a bi-layer or a multi-layer structure, for example, the first etch stop layer 104 and the second etch stop layer 105. The first etch stop layer 104 and the second etch stop layer 105 can be a metallic oxide material, a metallic nitride material, or other materials and/or combinations thereof. In cases where a bi-layer or a multi-layer structure is used, each of the first etch stop layer 104 and the second etch stop layer 105 may have a thickness of about 10 Å to about 30 Å.

The second dielectric layer 107 is deposited on the etch stop layer. Trenches 115 are then formed in the second dielectric layer 107. Some of the trenches 115 expose at least a portion of the first metal feature 103. In this embodiment, a first barrier sublayer 410 is disposed on the sidewall of the first etch stop layer 104, the second etch stop layer 105 and the second dielectric layer 107, and a second barrier sublayer 411 is disposed on the first barrier sublayer 410 and at least a portion of the first metal feature 103. In the areas where no first metal feature 103 is formed, the second barrier sublayer 411 is disposed on the first barrier sublayer 410 and at least a portion of the first dielectric layer 102. The first barrier sublayer 410 and second barrier sublayer 411 serve as a cap layer to prevent a metal (e.g., copper) that is subsequently deposited in the trench 115 from diffusing into the first dielectric layer 102 or the second dielectric layer 107. In some embodiment, the first barrier sublayer 410 can be a refractory metal nitride, such as TaN, TiN, WN, or RuN. In some embodiments, the second barrier sublayer 411 can be a metal, such as Co or Ru.

The second metal feature 109 is deposited on the second barrier sublayer 411 and fills the trench 115. As shown in FIG. 4, the second metal feature 109 is in contact with the second barrier sublayer 411, which is in contact with the first metal feature 103. The second metal feature 109 can be a metal alloy, such as an aluminum alloy. In one embodiment, the second metal feature 109 is an AlCu alloy. The cap layer 112 is then formed on the second metal feature 109. The cap layer 112 may be fabricated from the same material as the second barrier sublayer 411. By having the second metal feature 109 in contact with the second barrier sublayer 411, which is fabricated from a metal and is in contact with the first metal feature 103, the resistance between the first metal feature 103 and the second metal feature 109 can be reduced and the RC delay can be improved.

Figure 5:
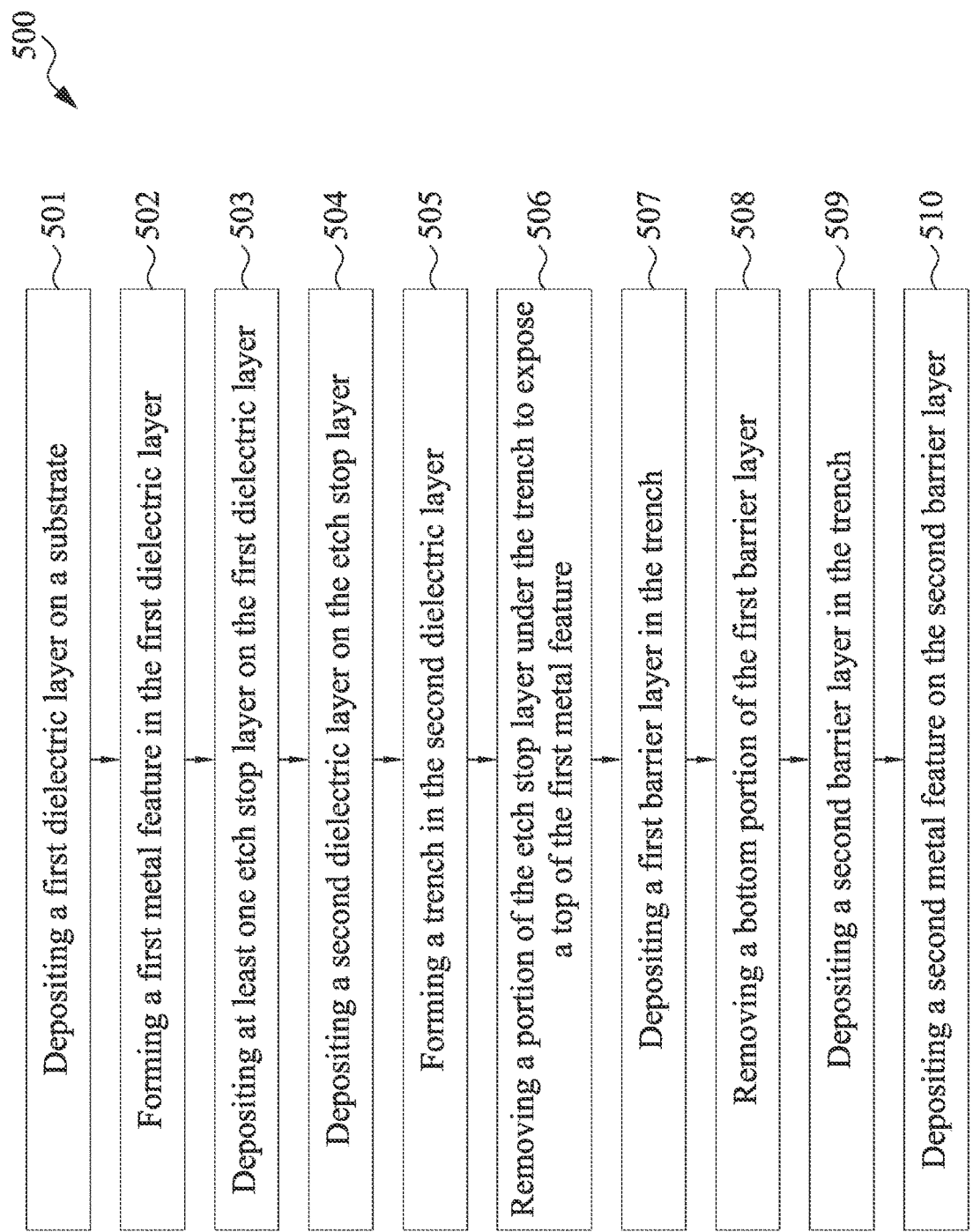
FIG. 5 is a flow chart of a method of manufacturing a semiconductor structure in accordance with some embodiments.
Figure 6A:
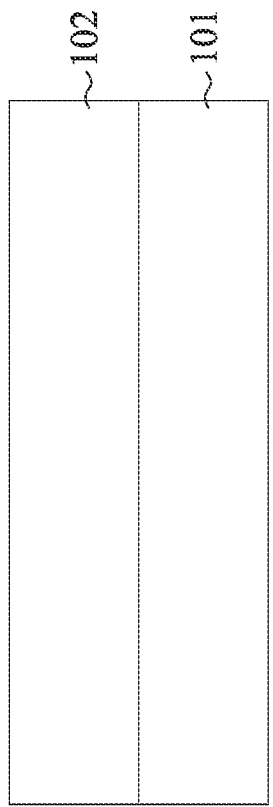
Figure 6B:
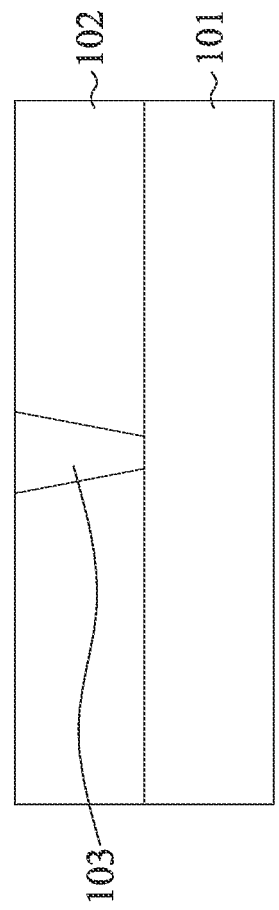
Figure 6C:
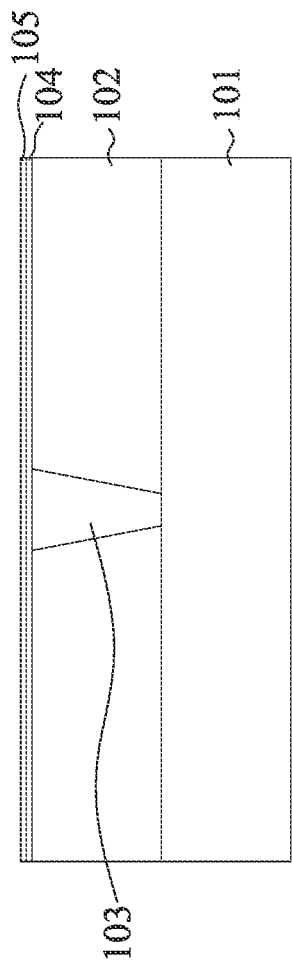

FIG. 5 is a flow chart of a method 500 for manufacturing the semiconductor structure 400 in accordance with some embodiments. FIGS. 6A-6L illustrate cross-sectional views in various stages of forming the semiconductor structure 400 in accordance with some embodiments. At operations 501 and 502, as shown in FIGS. 6A-6B, the first dielectric layer 102 is deposited on the substrate 101, and the first metal feature 103 is formed in the first dielectric layer 102 and in contact with the substrate 101. Referring to FIGS. 5 and 6C, at operation 503, at least one etch stop layer is deposited on the first dielectric layer 102 and the first metal feature 103. The etch stop layer can be a single layer structure, for example, the first etch stop layer 104, or a bi-layer or multi-layer structure, for example, the first etch stop layer 104 and a second etch stop layer 105, as shown in FIG. 6C.

Figure 6D:
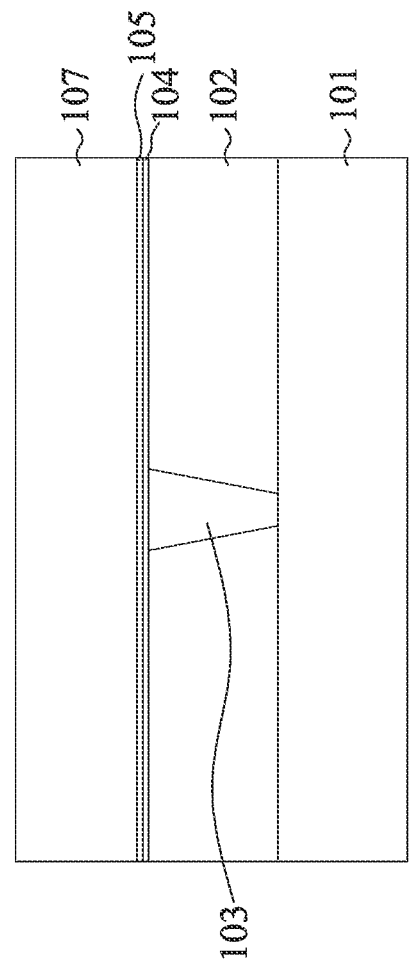

Referring to FIGS. 5 and 6D, at operation 504, the second dielectric layer 107 is deposited on the second etch stop layer 105. The second dielectric layer 107 can be low-k dielectrics, silicon dioxide, silicon nitrides, and/or silicon oxynitrides. The low-k material layer can be formed by CVD, a spin-on coating process, and/or any other suitable methods. Referring to FIGS. 5 and 6E, at operation 505, the trench 115 is formed in the second dielectric layer 107 to expose at least a portion of the second etch stop layer 105. Operation 505 can be performed by any suitable etching process, such as wet etching or dry etching process. At operation 506, one or more etching processes are performed to remove the exposed portions of the second etch stop layer 105 and the first etch stop layer 104 at the bottom of the trench 115 to expose the first metal feature 103 and the first dielectric layer 102, as shown in FIG. 6F. Operation 506 can be performed by any suitable etching process, such as wet etching or dry etching process.

Referring to FIGS. 5 and 6G, at operation 507, the first barrier sublayer 410 is formed on the exposed surfaces of the first metal feature 103 and the first dielectric layer 102 at the bottom of the trench 115. The first barrier sublayer 410 may be conformal on the sidewall and bottom of the trench 115. In some embodiment, the first barrier sublayer 410 can be TaN, TiN, WN, or RuN, and the deposition process used to deposit the first barrier sublayer 410 can be CVD, PVD, or ALD.

Referring to FIGS. 5 and 6H, at operation 508, after forming the first barrier sublayer 410 in the trench 115 and on the top of the first metal feature 103, a removal process is further performed to remove a portion of the first barrier sublayer 410 disposed at the bottom of the trench 115 and to expose at least a portion of the top of the first metal feature 103. The removal process may be an anisotropic etching process to remove the portion of the first barrier sublayer 410 formed on the bottom of the trench 115, while not affecting the portion of the first barrier sublayer 410 formed on the sidewall of the trench 115. The portion of the first barrier sublayer 410 formed on the top of the second dielectric layer 107 may be also removed by the anisotropic etching process, as shown in FIG. 6H. After performing the removal process, the first barrier sublayer 410 is remained on the sidewall of the trench 115, and at least a portion of the top of the first metal feature 103 is exposed.

Figure 6I:
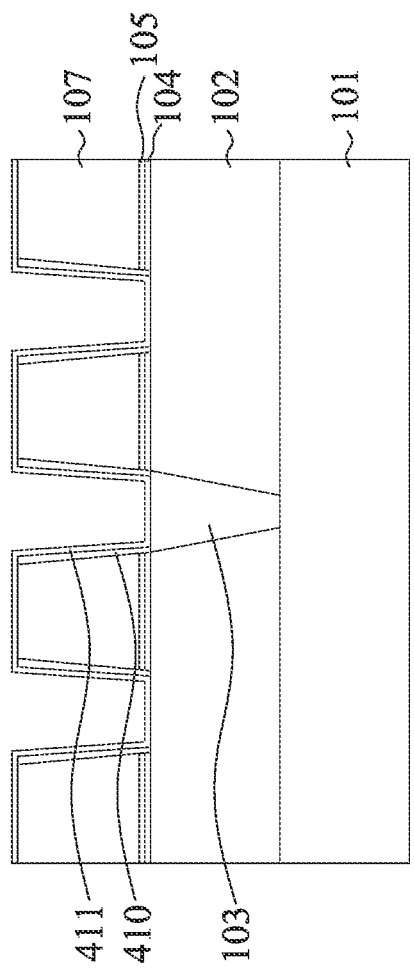

Then, at operation 509, the second barrier sublayer 411 is deposited on the first barrier sublayer 410 and on the exposed first metal feature 103, as shown in FIG. 6I. The second barrier sublayer 411 may include or be a transition metal, such as Co or Ru, and can be formed by CVD, PVD, ALD, or any suitable deposition technique. In some embodiments, the second barrier sublayer 411 may have a thickness of approximately 10 Å to 100 Å.

Figure 6J:
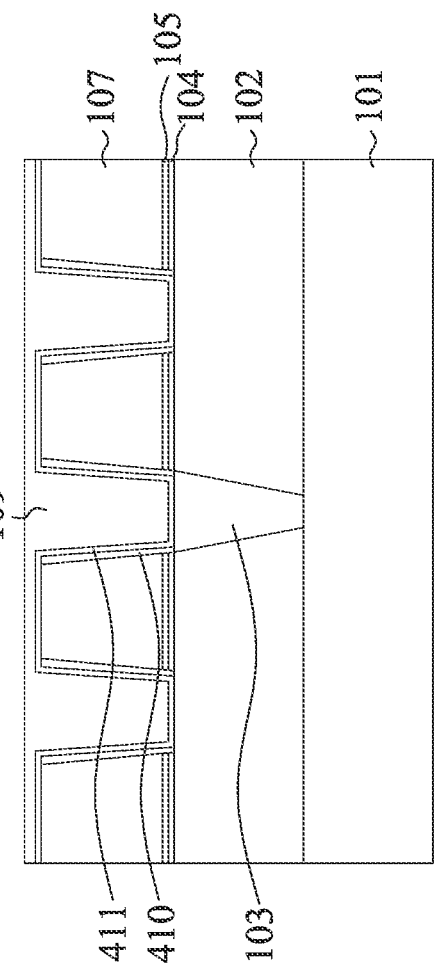
Figure 6K:
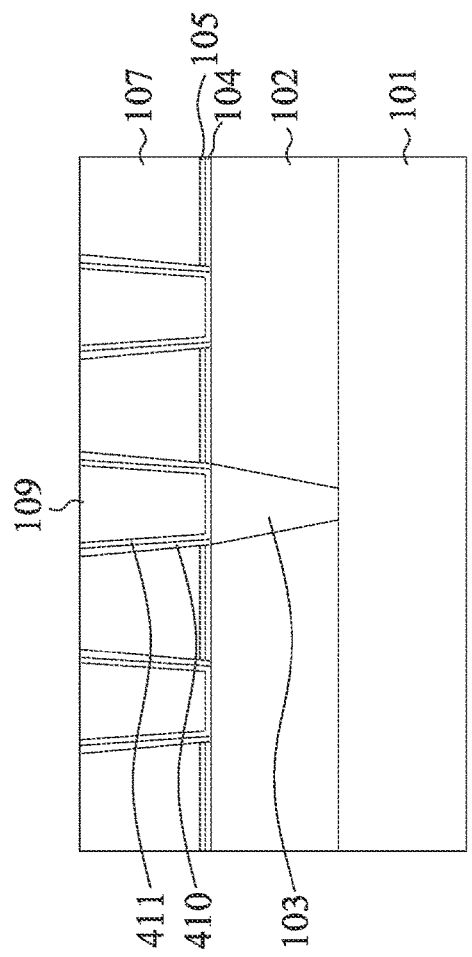
Figure 6L:
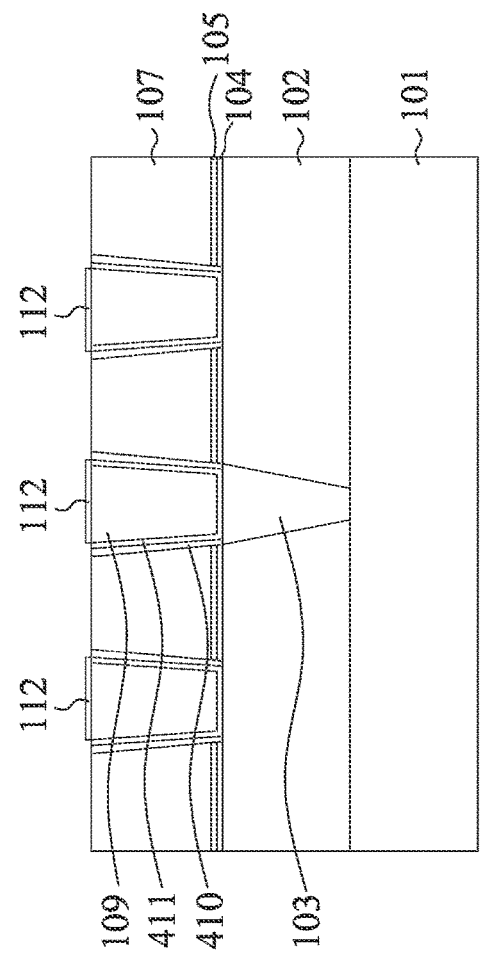

Referring to FIGS. 5 and 6J, at operation 510, a metal layer is deposited to fill the trench 115 to form the second metal feature 109 in the trench 115. The metal layer can be a Cu layer formed by an ECP process. After filling the trench 115 with the metal layer, a CMP process can be used to remove portions of the metal layer and the second barrier sublayer 411 to expose the second dielectric layer 107 and form the second metal feature 109. The top surfaces of the second barrier sublayer 411, and the second dielectric layer 107 are co-planar, as shown in FIG. 6K. In some embodiments, the top surface of the second metal feature 109 may be lower than the top surfaces of the second dielectric layer 107 and the second barrier sublayer 411 as a dishing effect from the CMP process. Next, the cap layer 112 can be selectively deposited on the second metal feature 109, as shown in FIG. 6L.

The removal process used at the stage of FIG. 6H removes the majority of the first barrier sublayer 410 from the bottom of the trench 115, which allows the first metal feature 103 and the second metal feature 109 to contact with the second barrier sublayer 411 (which is a conductive material). As a result, the resistance between the first metal feature 103 and the second metal feature 109 is reduced, resulting in an advantageous reduction of RC delay of the semiconductor structure 400.

Figure 7:
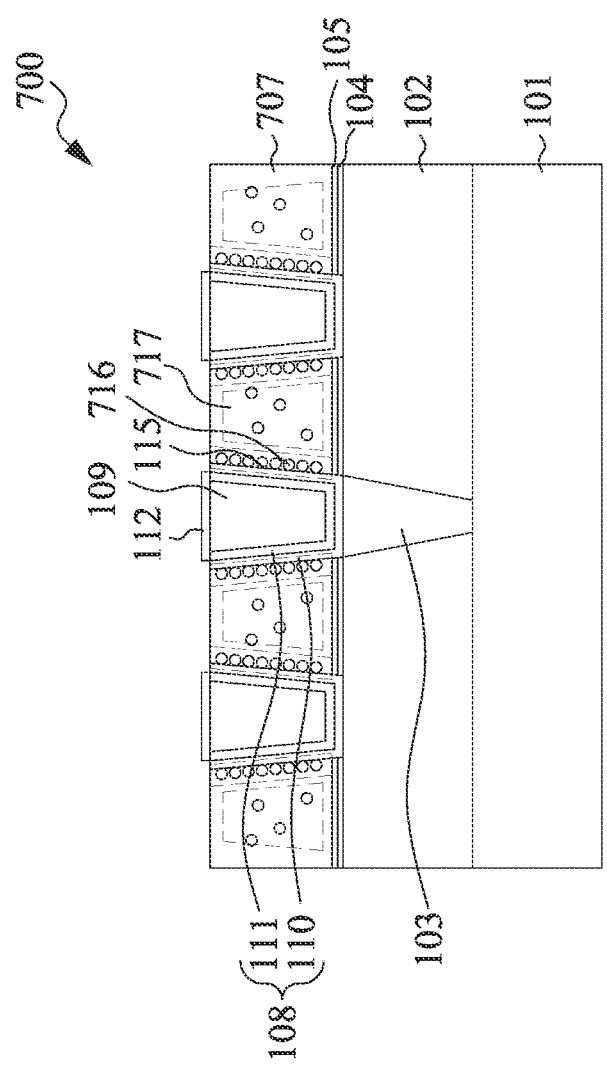
FIG. 7 is a cross-sectional view of a semiconductor structure in accordance with some embodiments.

FIG. 7 is a cross-sectional view of a semiconductor structure 700 in accordance with some embodiments. The semiconductor structure 700 includes the substrate 101, the first dielectric layer 102, the first metal feature 103, the one or more etch stop layers 104, 105, a second dielectric layer 707, the barrier layer 108 and the second metal feature 109. Unlike the second dielectric layer 107 as shown in FIG. 1, the second dielectric layer 707 have first implanted regions 716 and second implanted regions 717. The first implanted regions 716 are disposed along the sidewalls of the second dielectric layer 707 (e.g., adjacent the barrier layer 108). The second implanted regions 717 is adjacent the first implanted region 716, and the first implanted region 716 is between the sidewall of the second dielectric layer 707 and the second implanted region 717. For example, when two trenches 115 are adjacent to each other and first implanted regions 716 are formed in the second dielectric layer 707 adjacent to sidewalls of the two trenches, a second implanted region 717 is formed between the first implanted regions 716 of the two trenches 115. The first implanted region 716 and the second implanted region 717 may be formed by implanting dopants in the second dielectric layer 707 using, for example, a tilted implantation process. In some embodiments, the dopants may further penetrate into the one or more etch stop layers 104, 105.

The dopants in the second dielectric layer 707 may have a graded dopant concentration profile gradually changes between the sidewalls of the adjacent trenches 115. In some embodiments, the dopant concentration of the first implanted regions 716 is greater than the dopant concentration of the second implanted regions 717. The dopant concentration of the first implanted region 716 may be in a range of about $10^{18}$ dopant atoms/cm$^3$ to about $10^{22}$ dopant atoms/cm$^3$, and the dopant concentration of the second implanted region 717 may be in a range about $10^{12}$ dopant atoms/cm$^3$ to about $10^{15}$ dopant atoms/cm$^3$.

The implantation process may use a large size of dopants to densify the second dielectric layer 707 in the first implanted region 716 (e.g., adjacent the sidewalls of the trench 115) and to create more pores in the second dielectric layer 707. The dopants may have an atomic radius greater than 90 picometres (pm), such as from about 90 pm to 130 pm. Exemplary dopants may include, but are not limited to, aluminum (Al), silicon (Si), phosphorus (P), sulfur (S), chlorine (Cl), argon (Ar), gallium (Ga), germanium (Ge), arsenic (As), selenium (Se), bromine (Br), or krypton (Kr). As the majority of the dopants are blocked by the first barrier sublayer 110 and accumulated in the first implanted region 716, the second dielectric layer 707 in the first implanted region 716 can be densified due to the use of the large size dopants. The microstructure of the first implanted region 716 can also be strengthened due to its greater dopant concentration. Because of the difference in dopant concentration, the stress inside the low k material changes. The structure of the region having greater dopant concentration becomes more compact and forms an internal tensile stress, which makes the region having lower dopant concentration less densified. The densification of the second dielectric layer 707 in the first implanted region 716 renders the second implanted region 717, which has lower dopant concentration, to become less densified and thus, more pores are created in the second implanted region 717. The formation of the pores in the second implanted region 717 can lead to a lower k value of the second dielectric layer 707, which in turn reduces the RC delay of the semiconductor structure 700.

Alternatively, the dopants can be implanted vertically into the second dielectric layer 707 at 0° tilt (perpendicular to the top surface of the second dielectric layer 707) so that the dopants are evenly distributed in the second dielectric layer 707. In other words, the dopant concentration at the first implanted region 716 is substantially the same as the dopant concentration at the second implanted region 717. The even distribution of the dopants in the first and second implanted regions 716, 717 can help strengthen the microstructure of the second dielectric layer 707 and to fill any crevices that may otherwise formed between the second dielectric layer 707 and the barrier layer 108 during the formation of the barrier layer 108.

Figure 8:
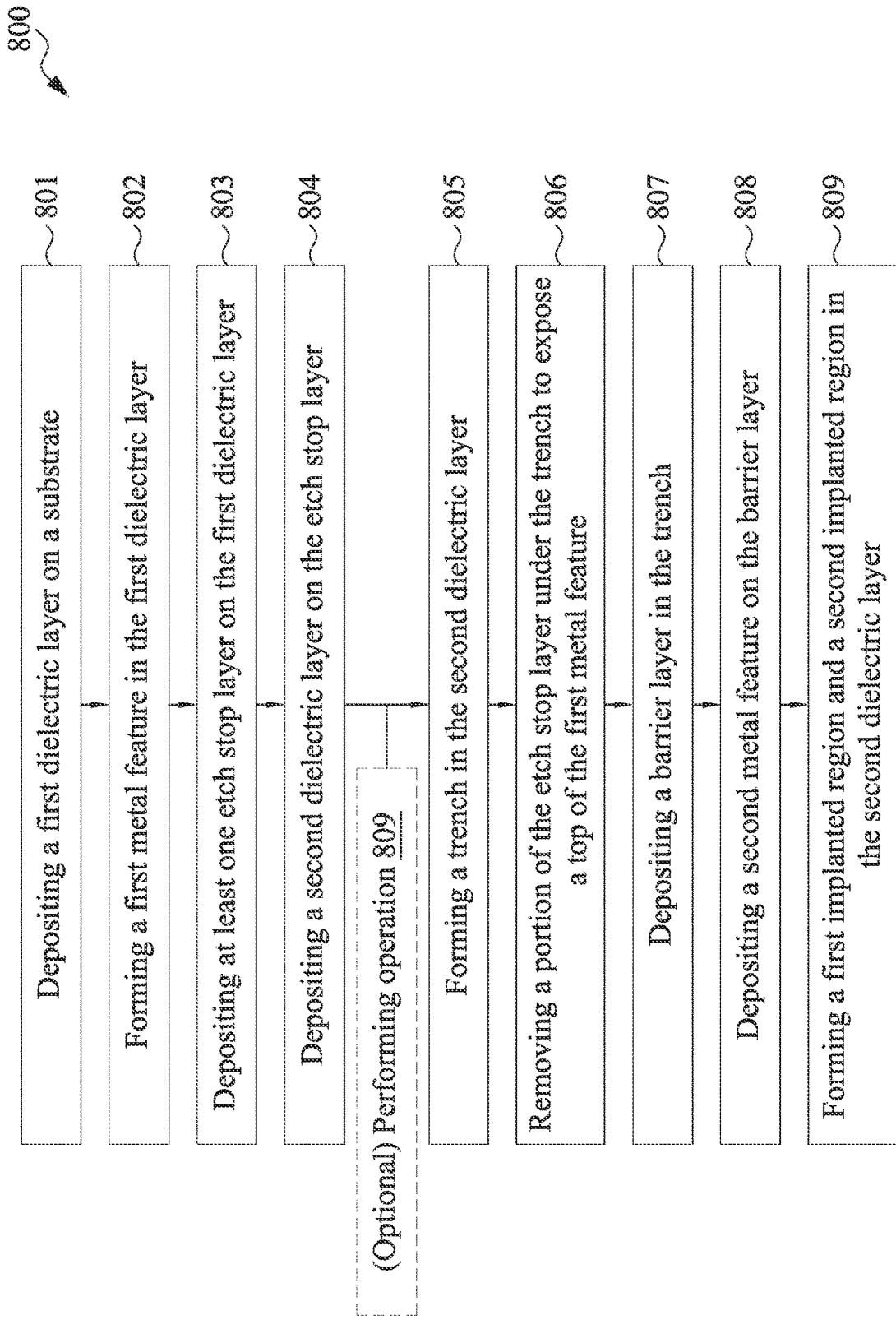
FIG. 8 is a flow chart of a method of manufacturing a semiconductor structure in accordance with some embodiments.
Figure 9E:
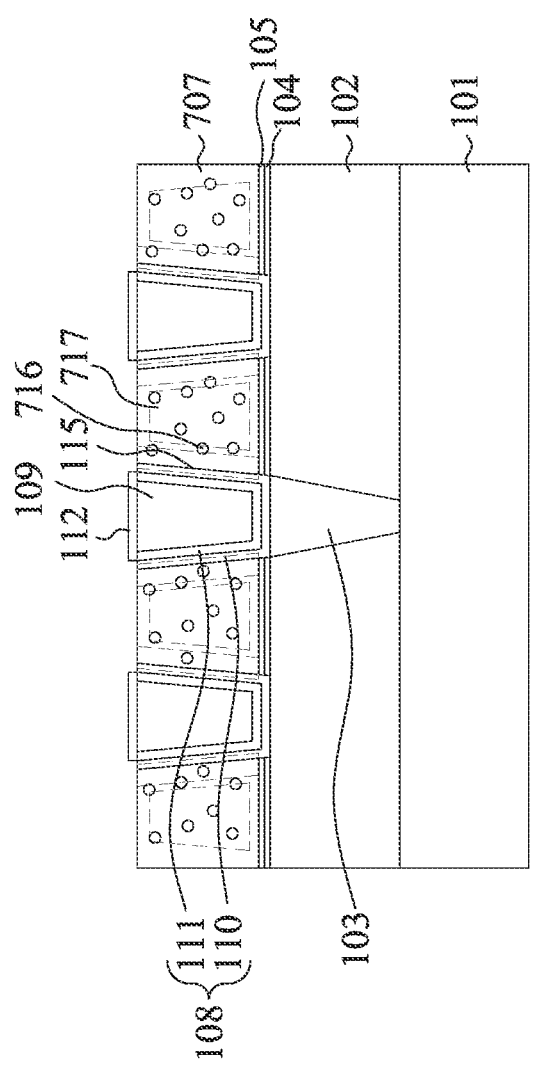

FIG. 8 is a flow chart of a method 800 of manufacturing the semiconductor structure 700 in accordance with some embodiments, and FIGS. 9A-9E illustrate cross-sectional views in various stages of forming the semiconductor structure 700 in accordance with some embodiments. At operation 801, the first dielectric layer 102 is deposited on the substrate 101, as shown in FIG. 9A. At operation 802, the first metal feature 103 is formed in the first dielectric layer 102 in contact with the substrate 101, as shown in FIG. 9A. At operation 803, the etch stop layer 104, or the etch stop layers 104 and 105, are deposited on the first dielectric layer 102, as shown in FIG. 9A. At operation 804, the second dielectric layer 707 is deposited on the etch stop layer 105, as shown in FIG. 9A. At operation 805, the trench 115 is formed in the second dielectric layer 707, as shown in FIG. 9A. At operation 806, a portion of the etch stop layers 104 and 105 at the bottom of the trench 115 are removed to expose the top of the first metal feature 103, as shown in FIG. 9A. At operation 807, the barrier layer 108 is formed on the sidewall of the second dielectric layer 707 and the etch stop layers 104 and 105, as shown in FIG. 9A. At operation 808, the second metal feature 109 is deposited on the barrier layer 108, as shown in FIG. 9A.

After forming the second metal feature 109 at operation 808, the cap layer 112 can be selectively formed on the second metal feature 109, as shown in FIG. 9A. At operation 809, the first implantation region 716 and the second implantation region 717 are formed in the second dielectric layer 707. The first and second implantation regions 716, 717 may be formed by first forming a mask 718 on the cap layers 712 to cover the second metal features 109, as shown in FIG. 9B. The mask 718 may be formed by any suitable patterning and photolithography processes.

In some embodiments, the implantation process can be a tilted implantation process. A tilted implantation is performed by directing ion streams 720 (7201, 720r) at an angle with respect to the surface of the layer to be implanted, such as the top surface of the second dielectric layer 707. Using the mask 718 and a selected angle of the tilted implantation, the ions can be directed to a predefined region, such as a region along the sidewalls of the second dielectric layer 707. In some embodiments, the tilted implantation process is performed in two operations: in the first operation, the ion stream 7201 is directed toward the left, so that dopants are implanted near the sidewalls of the second dielectric layer 707 at the left side of a region in the second dielectric layer 707; and in the second operation, the ion stream 720r is directed toward the right, so that the dopants are implanted near the sidewalls of the second dielectric layer 707 at the right side of the region in the second dielectric layer 707. By controlling the tilt angle and/or dosage of the dopants in the tilted implantation, the first implanted region 716 can have a dopant concentration greater than the second implanted region 717, as shown in FIG. 9C.

In some embodiments, the implantation process can be a vertical implantation process in which the ion streams 720 are substantially perpendicular to the top surface of the second dielectric layer 707, as shown in FIG. 9D. In some embodiments, the vertical implantation may be performed as a blanket process and the mask 718 is not present. By performing the blanket vertical implantation process, the dopant concentration of the first implanted region 716 may be substantially the same as the dopant concentration of the second implanted region 717, as shown in FIG. 9E.

Figure 10E:
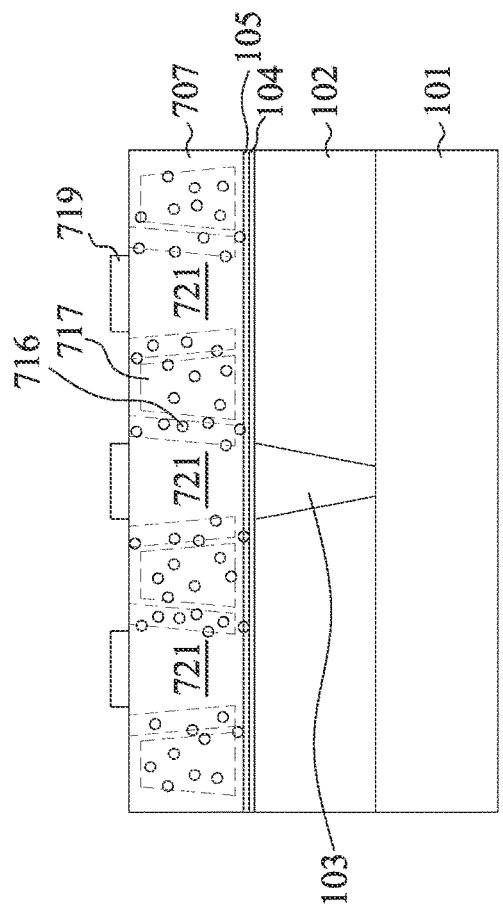
Figure 10F:
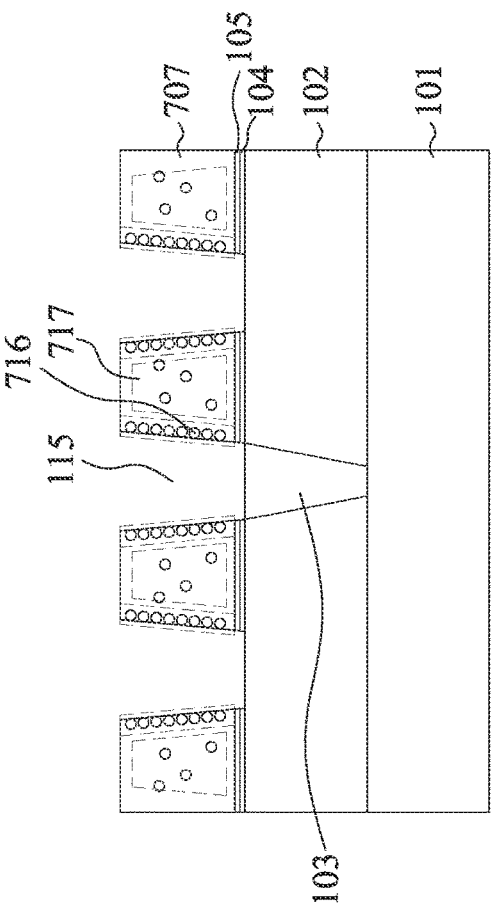

In some embodiments, operation 809 can be performed after operation 804 and before operation 805, as shown by the dash line in FIG. 8. FIGS. 10A-10G illustrate cross-sectional views in various stages of forming the semiconductor structure 700 by performing operation 809 after operation 804. As shown in FIG. 10A, at operation 804, the second dielectric layer 707 is deposited on the second etch stop layer 105. At operation 809, as shown in FIGS. 10B and 10C, the first and second implanted regions 716, 717 are formed in the second dielectric layer 707. The first and second implanted regions 716, 717 may be formed by first forming a patterned mask 719 on the second dielectric layer 707 and then performing an implantation process. The mask 719 covers regions 721 of the second dielectric layer 707 to be removed at operation 805 to form the trenches 115 (FIG. 10F). The implantation process may be a tilted implantation process similar to the tilted implantation process described in FIG. 9B. Thus, the first implanted regions 716 may be adjacent the regions 721 of the second dielectric layer 707 (i.e., adjacent the sidewall of trenches 115 after the formation of the trenches 115). The first implanted regions 716 may have a higher concentration of dopants than the second implanted region 717 as a result of the tilted implantation process.

In some embodiments, at operation 809, the implantation process can be a vertical implantation process, as shown in FIG. 10D. Unlike the blanket vertical implantation process described in FIG. 9D, the mask 719 is utilized in operation 809 to prevent dopants from entering regions 721 in the second dielectric layer 707 where the trenches 115 are to be formed. By performing the vertical implantation process, the dopant concentration of the first implanted region 716 may be substantially the same as the dopant concentration of the second implanted region 717, as shown in FIG. 10E.

Figure 10G:
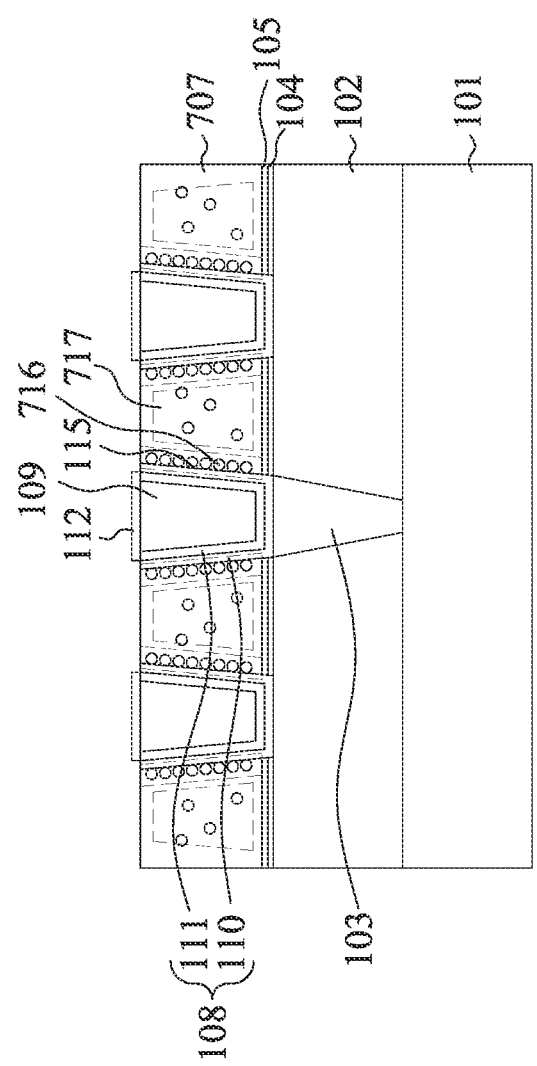

After the implantation process to the first implanted region 716 and the second implanted region 717 is performed, at operation 805, the trenches 115 are formed in the second dielectric layer 707, and, at operation 806, a portion of the etch stop layers 104 and 105 at the bottom of the trenches 115 are removed to expose the top of the first metal feature 103 and portions of the first dielectric layer 102, as shown in FIG. 10F. With the second dielectric layer 707 having the first implanted regions 716, undercut defects in the second dielectric layer 707 are reduced due to the strengthened sidewalls of the trench 115. At operation 807, the barrier layer 108 is formed in the trench 115, and, at operation 808, the second metal feature 109 is formed on the barrier layer 408 in the trench 115. In some embodiments, the cap layer 112 can be selectively deposed on the second metal feature 109, as shown in FIG. 10G.

Figure 11:
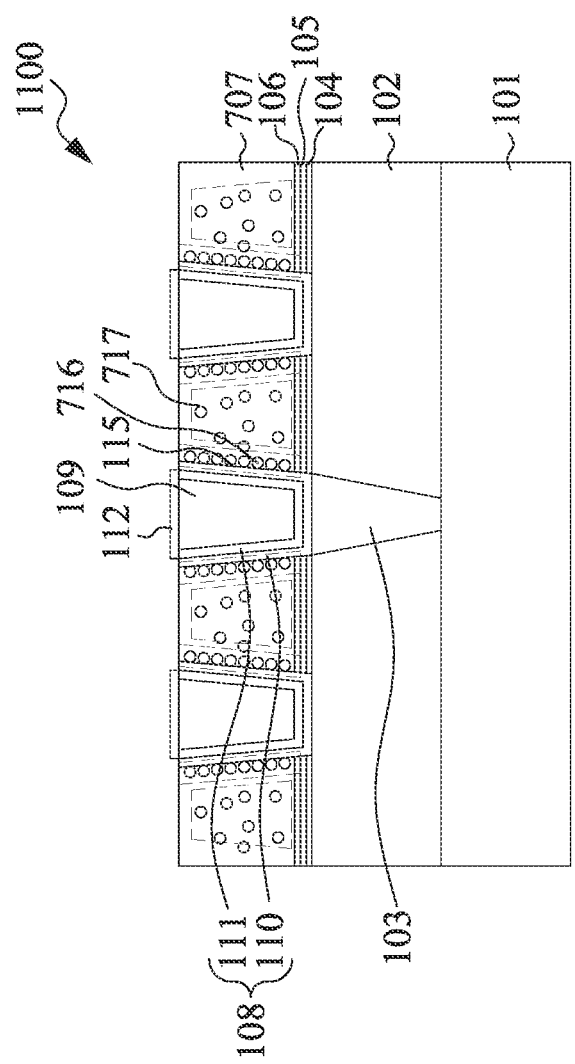
FIG. 11 is a cross-sectional view of a semiconductor structure in accordance with some embodiments.

FIG. 11 is a cross-sectional view of a semiconductor structure 1100 in accordance with some embodiments. The embodiments described above disclose several specific features, and these features can be applied to the semiconductor structure separately or in combination. For example, in FIG. 11, the semiconductor structure 1100 includes and combines some specific features described in FIGS. 1, 4 and 7. The semiconductor structure 1100 includes the first etch stop layer 104, the second etch stop layer 105 and the third etch stop layer 106 sequentially formed on the first dielectric layer 102. By forming the tri-layer structure of the etch stop layer, the undercut defects under the second dielectric layer 707 caused during removal of the etch stop layer(s) from the bottom of the trench 115 can be reduced or even prevented. The semiconductor structure 1100 further includes the first barrier sublayer 410 and the second barrier sublayer 411. The first barrier sublayer 410 is disposed on the sidewall of the second dielectric layer 707, the first etch stop layer 104, the second etch stop layer 105 and the third etch stop layer 106, and the second barrier sublayer 411 is disposed on the first barrier sublayer 410 and in contact with the first metal feature 103. By forming the second barrier sublayer 411 in contact with the first metal feature 103, the resistance between the first metal feature 103 and the second metal feature 109 can be reduced and the RC delay can be improved. The semiconductor structure 1100 further includes the first implanted region 716 and the second implanted region 717 formed in the second dielectric layer 707. By forming the first implanted region 716 and the second implanted region 717, the k-value and the capacity of the low-k material of the second dielectric layer 707 can be decreased, and the RC delay can be further improved.

In the present application, the semiconductor structure and the manufacturing method are developed to reduce the RC delay and prevent the current leakage between neighboring metal lines. The present application provides some features including using at least three etch stop layers fabricated from at least two different materials to prevent the undercut defects, performing a removal process after forming the first barrier sublayer to improve the RC value, and forming the implanted regions in the second dielectric layers to both prevent the undercut defects and improve the RC value.

In one embodiment, a semiconductor structure includes a first dielectric layer, a first metal feature in the first dielectric layer, at least one etch stop layer on the first dielectric layer, a second dielectric layer on the at least one etch stop layer. The semiconductor structure further includes a first barrier sublayer on a sidewall of the second dielectric layer and the at least one etch stop layer, a second barrier sublayer on the first barrier sublayer and the first metal feature, and a second metal feature on the second barrier sublayer.

In another embodiment, a semiconductor structure includes a first dielectric layer, a first metal feature in the first dielectric layer, at least one etch stop layer on the first dielectric layer, a second dielectric layer on the at least one etch stop layer. The second dielectric layer includes an implanted region along a sidewall of the second dielectric layer. The semiconductor structure further includes a barrier layer on the sidewall of the second dielectric layer and the at least one etch stop layer and in contact with the first metal feature, and a second metal feature on the barrier layer.

In yet another embodiment, a method for manufacturing a semiconductor structure includes depositing a first dielectric layer on a substrate, forming a first metal feature in the first dielectric layer, depositing at least one etch stop layer on the first dielectric layer, depositing a second dielectric layer on the at least one etch stop layer, forming a trench in the second dielectric layer and the at least one etch stop layer, and the first metal feature is exposed through the trench. The method further includes forming a first barrier sublayer on a sidewall of the second dielectric layer, depositing a second barrier sublayer on the first barrier sublayer and the first metal feature, and depositing a second metal feature on the second barrier sublayer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first dielectric layer;
a first metal feature in the first dielectric layer;
at least one etch stop layer on the first dielectric layer;
a second dielectric layer on the at least one etch stop layer;
a first barrier sublayer on a sidewall of the second dielectric layer and the at least one etch stop layer;
a second barrier sublayer on the first barrier sublayer and the first metal feature; and
a second metal feature on the second barrier sublayer.

2. The semiconductor structure of claim 1, wherein the first barrier sublayer comprises a metal nitride, and the second barrier sublayer comprises a transition metal.

3. The semiconductor structure of claim 2, further comprising a cap layer on a top surface of the second metal feature.

4. The semiconductor structure of claim 1, wherein the at least one etch stop layer comprises a first etch stop layer, a second etch stop layer and a third etch stop layer.

5. The semiconductor structure of claim 4, wherein the first etch stop layer comprises a first material, the second etch stop layer comprises a second material, and the third etch stop layer comprises a third material, wherein the second material is different from the first and third materials.

6. The semiconductor structure of claim 5, wherein the first etch stop layer comprises aluminum nitride, the second etch stop layer comprises aluminum oxide, and the third etch stop layer comprises aluminum nitride.

7. A semiconductor structure, comprising:
a first dielectric layer;
a first metal feature in the first dielectric layer;
at least one etch stop layer on the first dielectric layer;
a second dielectric layer on the at least one etch stop layer, wherein the second dielectric layer comprises an implanted region along a sidewall of the second dielectric layer;
a barrier layer comprising:
a first barrier sublayer on the sidewall of the second dielectric layer and the at least one etch stop layer; and
a second barrier sublayer on the first barrier sublayer and the first metal feature; and
a second metal feature on the barrier layer.

8. The semiconductor structure of claim 7, wherein the implanted region comprises:
a first implanted region along the sidewall of the second dielectric layer; and
a second implanted region adjacent the first implanted region, wherein the first implanted region is between the sidewall of the second dielectric layer and the second implanted region, and a dopant concentration of the first implanted region is greater than a dopant concentration of the second implanted region.

9. The semiconductor structure of claim 8, wherein the dopant comprises germanium or argon.

10. The semiconductor structure of claim 7, wherein the first barrier sublayer in contact with the first metal feature.

11. The semiconductor structure of claim 7, wherein the second barrier sublayer is in contact with at least a portion of a top of the first metal feature.

12. The semiconductor structure of claim 7, wherein the at least one etch stop layer comprises a first etch stop layer, a second etch stop layer and a third etch stop layer.

13. The semiconductor structure of claim 12, wherein the first etch stop layer comprises aluminum nitride, the second etch stop layer comprises aluminum oxide, and the third etch stop layer comprises aluminum nitride.

14. A semiconductor structure, comprising:
a first dielectric layer;
a first metal feature in the first dielectric layer;
a first etch stop layer on the first dielectric layer;
a second etch stop layer on the first etch stop layer;
a third etch stop layer on the second etch stop layer;
a second dielectric layer on the third etch stop layer;
a first barrier sublayer on a sidewall of the second dielectric layer and the first, second, and third etch stop layers;
a second barrier sublayer on the first barrier sublayer and the first metal feature; and
a second metal feature on the second barrier sublayer.

15. The semiconductor structure of claim 14, wherein the second etch stop layer is formed from a material different than materials in the first and second etch stop layer.

16. The semiconductor structure of claim 14, wherein the second barrier sublayer is in contact with the first metal feature.

17. The semiconductor structure of claim 14, wherein the first barrier sublayer is in contact with the first metal feature.

18. The semiconductor structure of claim 17, wherein the second dielectric layer includes a first implanted region and a second implanted region, the first implanted region is along the sidewall of the second dielectric layer and the second implanted region is adjacent the first implanted region, wherein the first implanted region is between the sidewall of the second dielectric layer and the second implanted region.

19. The semiconductor structure of claim 18, wherein a dopant concentration of the first implanted region is greater than a dopant concentration of the second implanted region.

20. The semiconductor structure of claim 18, wherein the dopant comprises one of germanium and argon.

* * * * *